(12) United States Patent
Liaw

(10) Patent No.: US 11,997,844 B2
(45) Date of Patent: *May 28, 2024

(54) SRAM STRUCTURES WITH IMPROVED WRITE WORD LINE PLACEMENT

(71) Applicant: Taiwan Semiconductor Manufacturing Company, Ltd., Hsin-Chu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/067,003

(22) Filed: Dec. 15, 2022

(65) Prior Publication Data

US 2023/0124514 A1    Apr. 20, 2023

Related U.S. Application Data

(63) Continuation of application No. 17/337,015, filed on Jun. 2, 2021, now Pat. No. 11,581,321.

(51) Int. Cl.
*H10B 10/00* (2023.01)
*H01L 23/528* (2006.01)
*H01L 27/092* (2006.01)

(52) U.S. Cl.
CPC .......... *H10B 10/12* (2023.02); *H01L 23/528* (2013.01); *H01L 27/0924* (2013.01)

(58) Field of Classification Search
CPC ... H10B 10/12; H01L 23/528; H01L 27/0924; H01L 27/0207; H01L 23/5386
See application file for complete search history.

(56) References Cited

U.S. PATENT DOCUMENTS

| | | |
|---|---|---|
| 8,144,540 B2 | 3/2012 | Liaw |
| 9,024,392 B2 | 5/2015 | Liaw |
| 9,424,889 B1 | 8/2016 | Liaw |
| 9,640,540 B1 | 5/2017 | Liaw |
| 9,659,599 B1 | 5/2017 | Liaw |
| 9,672,903 B2 | 6/2017 | Liaw |
| 9,704,564 B2 | 7/2017 | Liaw |
| 9,892,781 B2 | 2/2018 | Liaw |
| 9,905,290 B2 | 2/2018 | Liaw |

(Continued)

*Primary Examiner* — Karen Kusumakar
*Assistant Examiner* — Adam S Bowen
(74) *Attorney, Agent, or Firm* — Haynes and Boone, LLP

(57) ABSTRACT

Integrated circuit ("IC") layouts are disclosed for improving performance of memory arrays, such as static random access memory ("SRAM"). An exemplary IC device includes an SRAM cell and an interconnect structure electrically coupled to the SRAM cell. The interconnect structure includes a first metal layer electrically coupled to the SRAM cell that includes a bit line, a first voltage line having a first voltage, a word line landing pad, and a second voltage line having a second voltage that is different than the first voltage. The first voltage line is adjacent the bit line. The word line landing pad is adjacent the first voltage line. The second voltage line is adjacent the word line landing pad. A second metal layer is disposed over the first metal layer. The second metal layer includes a word line that is electrically coupled to the word line landing pad.

20 Claims, 18 Drawing Sheets

(56) References Cited

U.S. PATENT DOCUMENTS

| | | |
|---|---|---|
| 10,050,042 B2 | 8/2018 | Chen et al. |
| 10,128,253 B2 | 11/2018 | Liaw |
| 10,276,581 B1 * | 4/2019 | Liaw ............... H01L 21/823871 |
| 10,411,019 B2 | 9/2019 | Fujiwara et al. |
| 2018/0122812 A1 | 5/2018 | Liaw |

* cited by examiner

SRAM STRUCTURES WITH IMPROVED WRITE WORD LINE PLACEMENT

This is a continuation application of U.S. patent application Ser. No. 17/337,015, filed Jun. 2, 2021, the entire disclosure of which is incorporated herein by reference.

BACKGROUND

Static random access memory ("SRAM") generally refers to any memory or storage that can retain stored data only when power is applied. With the increasing demanding requirement to the speed of integrated circuits, the read speed and write speed of SRAM cells also become more important. One technique for improving performance includes placing bit-lines of SRAM cells in the lowest metal layer to reduce capacitance. However, with the increasingly down-scaling of the already very small SRAM cells, however, such request is difficult to achieve as metal thickness and width continue to shrink. The down-scaling further limits logic circuit routing considerations due to the metal pitch limitation. Accordingly, current SRAM cell layouts have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
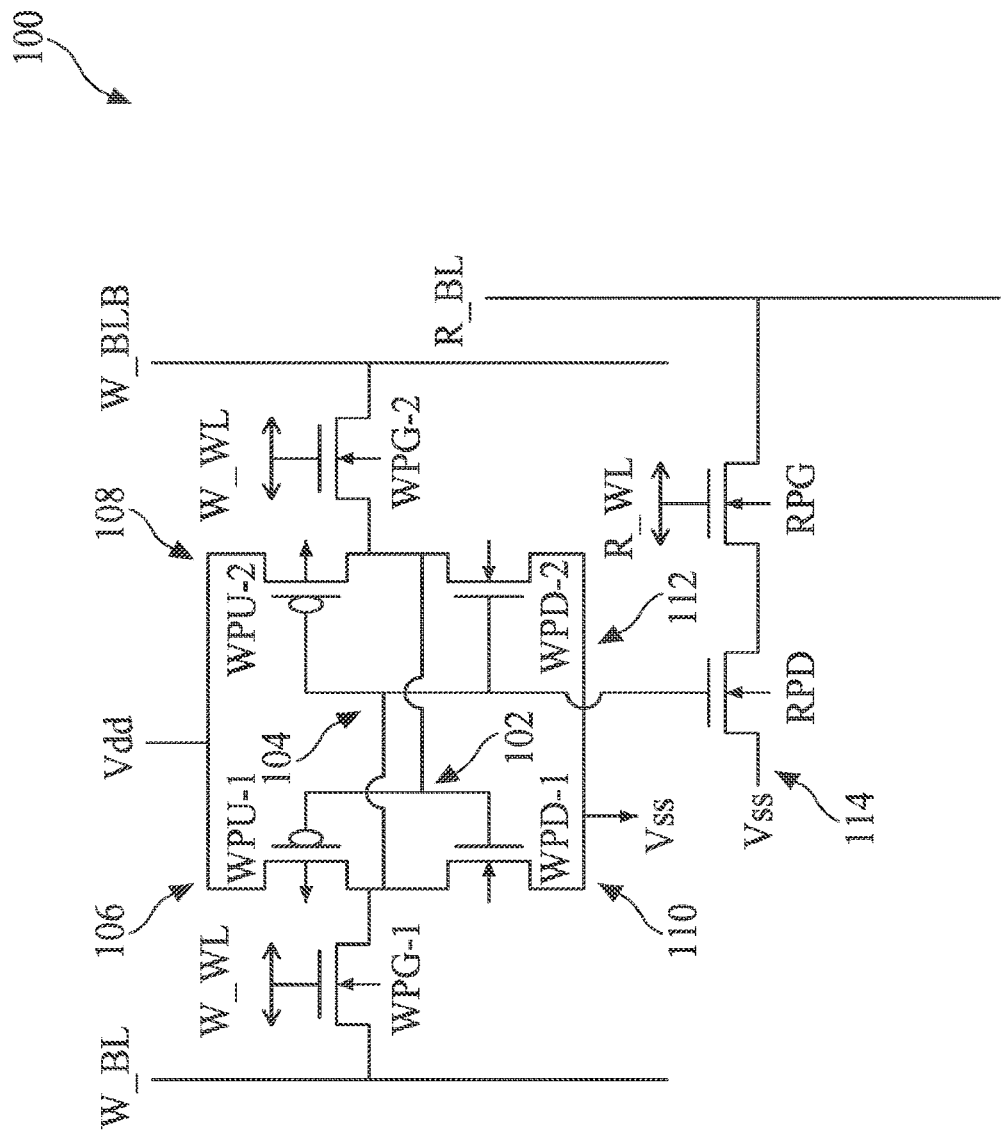
FIG. 1 illustrates a circuit diagram of a two-port Static Random Access Memory (SRAM) cell according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

A Static Random Access Memory (SRAM) cell and the corresponding SRAM array are provided in accordance with various exemplary embodiments. Some variations of some embodiments are discussed. Throughout the various views and illustrative embodiments, like reference numbers are used to designate like elements.

FIG. 1 illustrates a circuit diagram of a two-port SRAM cell 100 in accordance with some embodiments. Two-port SRAM cell 100 includes eight transistors and can make one read and one write within a single clock cycle. SRAM cell 100 includes write pull-up transistors WPU-1 and WPU-2, which are P-type Metal-Oxide-Semiconductor (PMOS) transistors, and write pull-down transistors WPD-1, WPD-2, read pull-down transistor RPD, pass-gate transistors WPG-1, WPG-2, and read pass-gate transistor RPG, which are N-type Metal-Oxide-Semiconductor (NMOS) transistors. Gates of pass-gate transistors WPG-1 and WPG-2 are controlled by a write word-line W_WL that determines whether or not SRAM cell 100 is selected for writing. A gate of pass-gate transistor RPG is controlled by a read word-line R_WL that determines whether or not SRAM cell 100 is selected for reading. A latch formed of write pull-up transistors WPU-1 and WPU-2 and write pull-down transistors WPD-1 and WPD-2 stores a bit, wherein complementary values of the bit are stored in Storage Data (SD) node 102 and SD node 104. The stored bit can be written into SRAM cell 100 through complementary bit lines including a write bit-line W_BL and a write bit-line bar W_BLB. The stored bit can be read from SRAM cell 100 through a read bit-line R_BL. SRAM cell 100 is powered through a positive power supply node Vdd that has a positive power supply voltage (also denoted as VDD). SRAM cell 100 is also connected to a power supply voltage Vss (also denoted as VSS), which may be an electrical ground. Transistors WPU-1 and WPD-1 form a first inverter. Transistors WPU-2 and WPD-2 form a second inverter. The input of the first inverter is connected to transistor WPG-1 and the output of the second inverter. The output of the first inverter is connected to transistor WPG-2 and the input of the second inverter. The output of the second inverter controls the read pull-down transistor RPD.

Sources of pull-up transistors WPU-1 and WPU-2 are connected to Vdd node 106 and Vdd node 108, respectively, which are further connected to power supply voltage/line Vdd. Sources of pull-down transistors WPD-1 and WPD-2 are connected to Vss node 110 and Vss node 112, respectively, which are further connected to power supply voltage/line Vss. A source of pull-down transistor RPD is connected to Vss node 114, which is further connected to power supply voltage/line Vss. A drain of pull-down transistor RPD is connected to a source/drain region of pass-gate transistor RPG. The gates of transistors WPU-1 and WPD-1 are connected to drains of transistors WPU-2 and WPD-2, which form a connection node that is referred to as SD node 102. The gates of transistors WPU-2, WPD-2 and the gate of transistor RPD are connected to drains of transistors WPU-1 and WPD-1, which form a connection node that is referred to as SD node 104. A source of pass-gate transistor WPG-1 is connected to write bit line W_BL. A source of pass-gate transistor WPG-2 is connected to write bit line W_BLB. A source of pass-gate transistor RPG is connected to read bit line R_BL.

Figure 2:
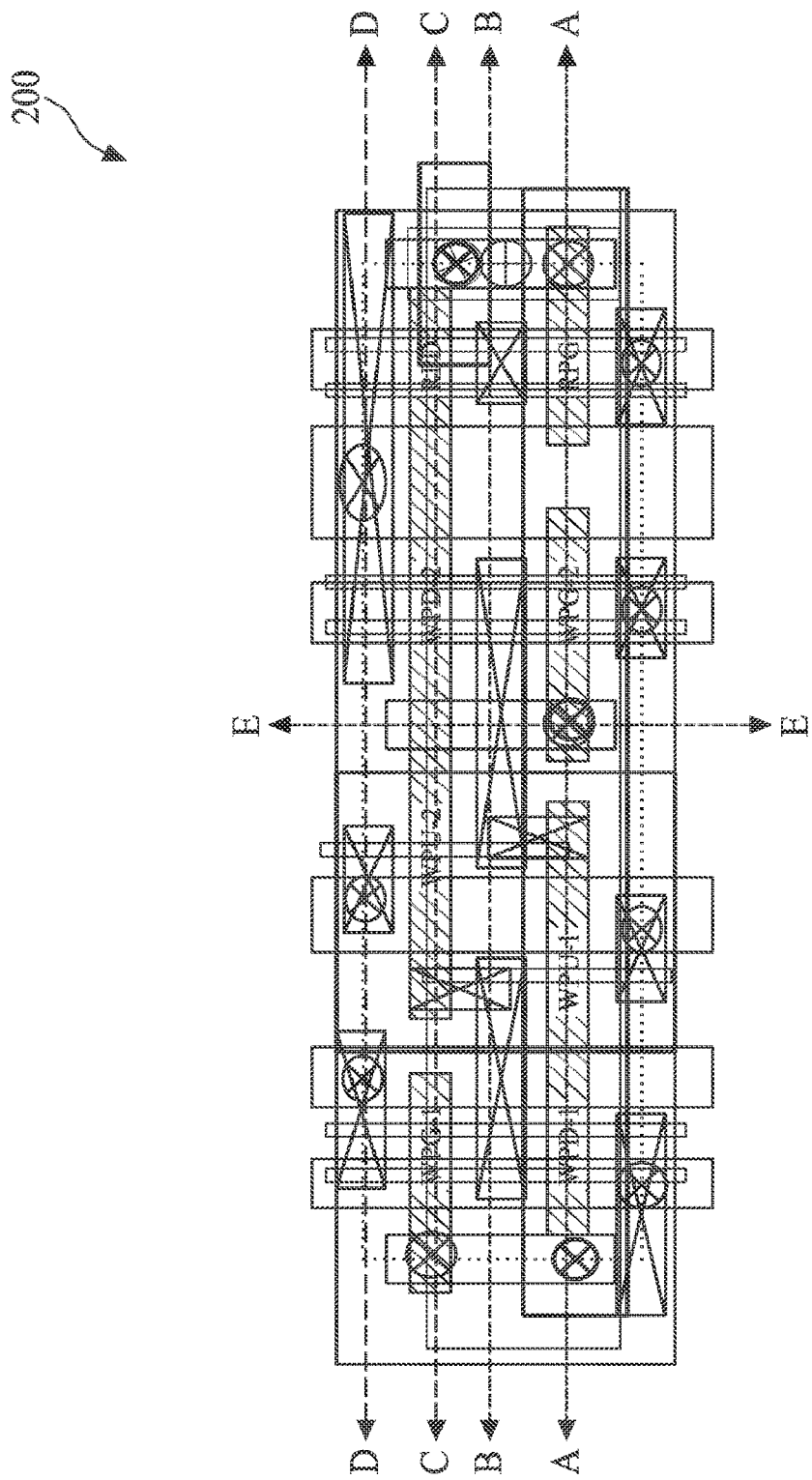
FIG. 2 illustrates a top view of an exemplary layout of a two-port SRAM cell according to various aspects of the present disclosure.
Figure 3A:
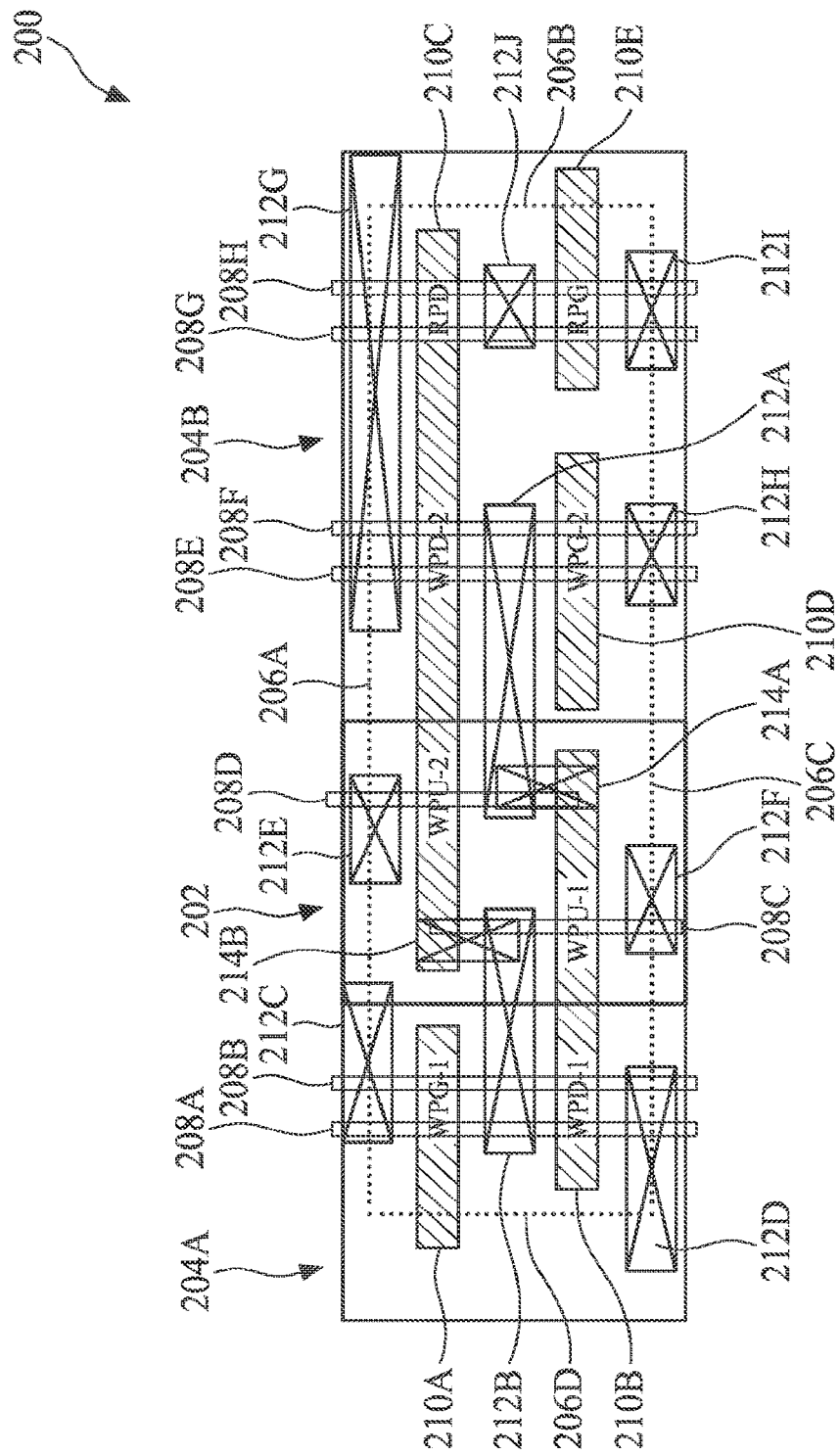
FIGS. 3A-3C illustrate top views of individual layers of an exemplary layout of a two-port SRAM cell according to various aspects of the present disclosure.
Figure 3B:
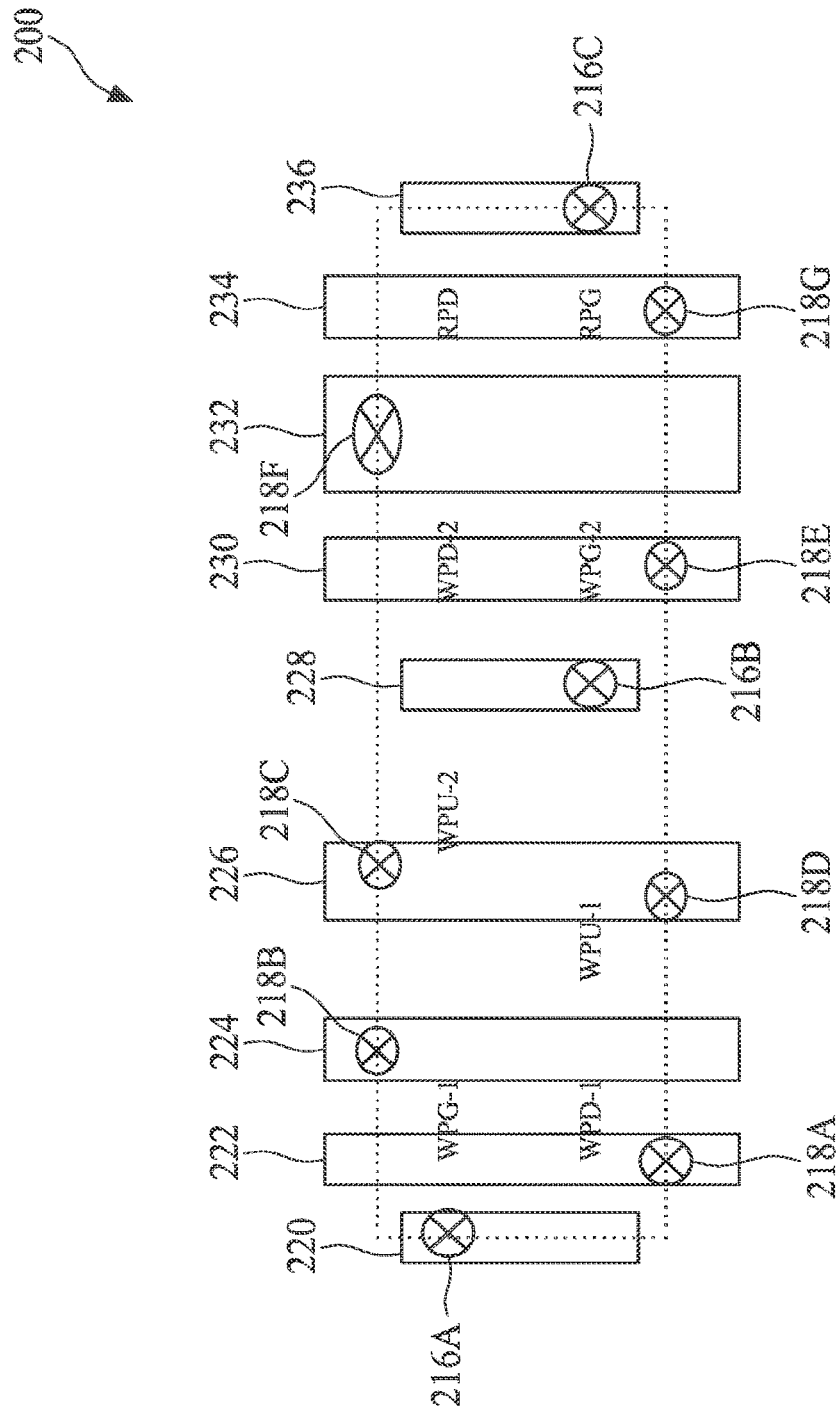
Figure 3C:
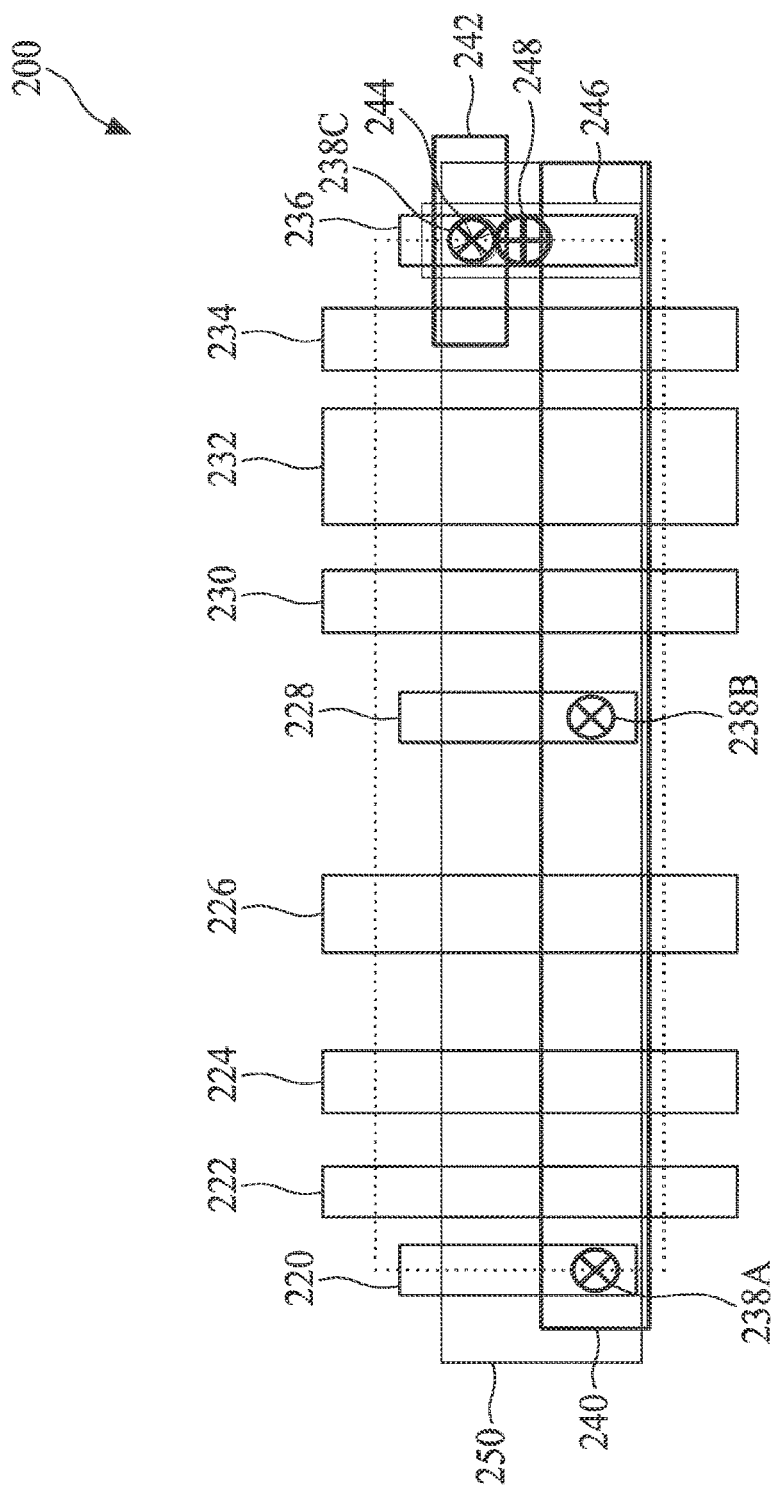
Figure 4A:
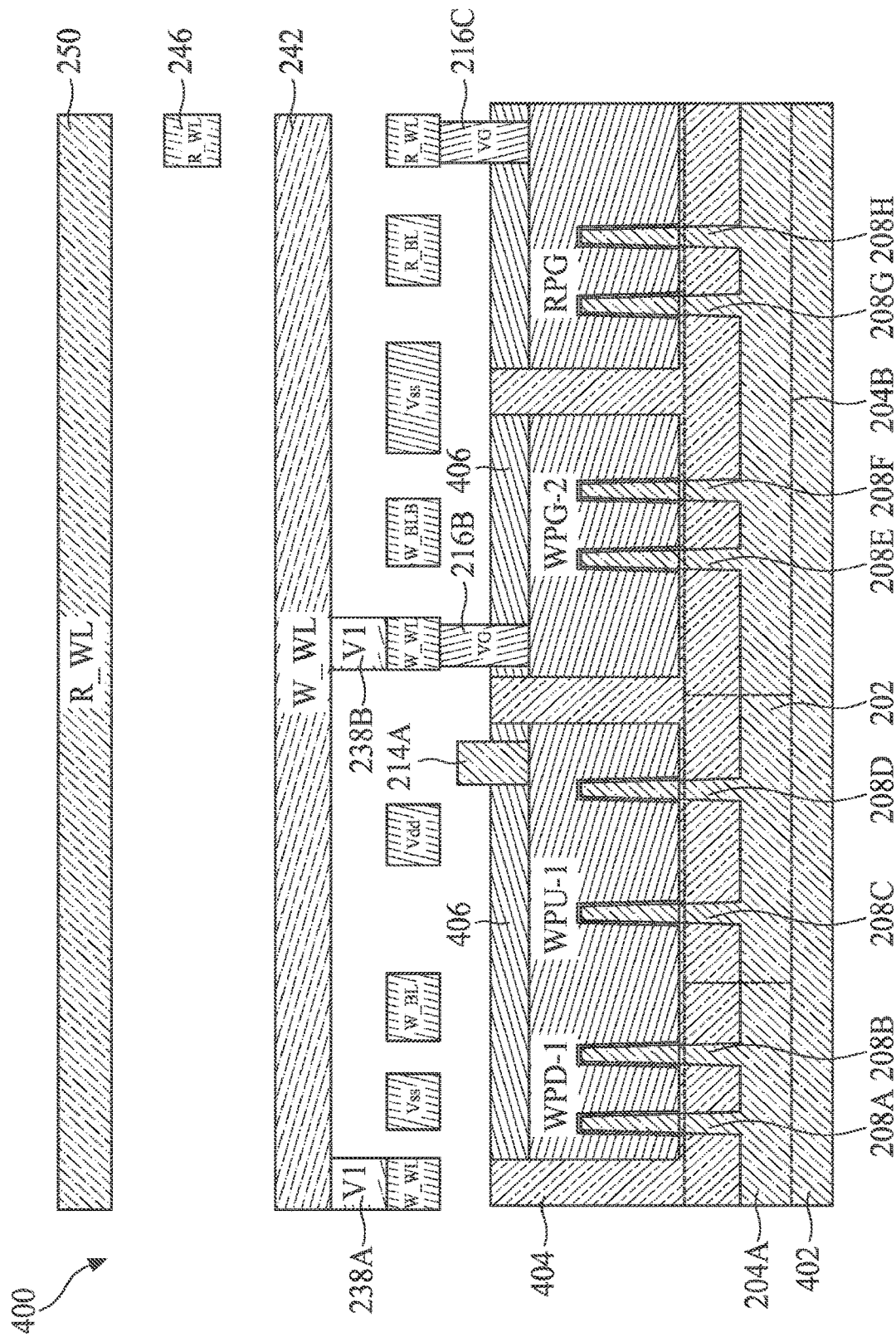
FIGS. 4A-4E illustrate cross-sectional views of an exemplary layout of a two-port SRAM cell according to various aspects of the present disclosure.
Figure 4B:
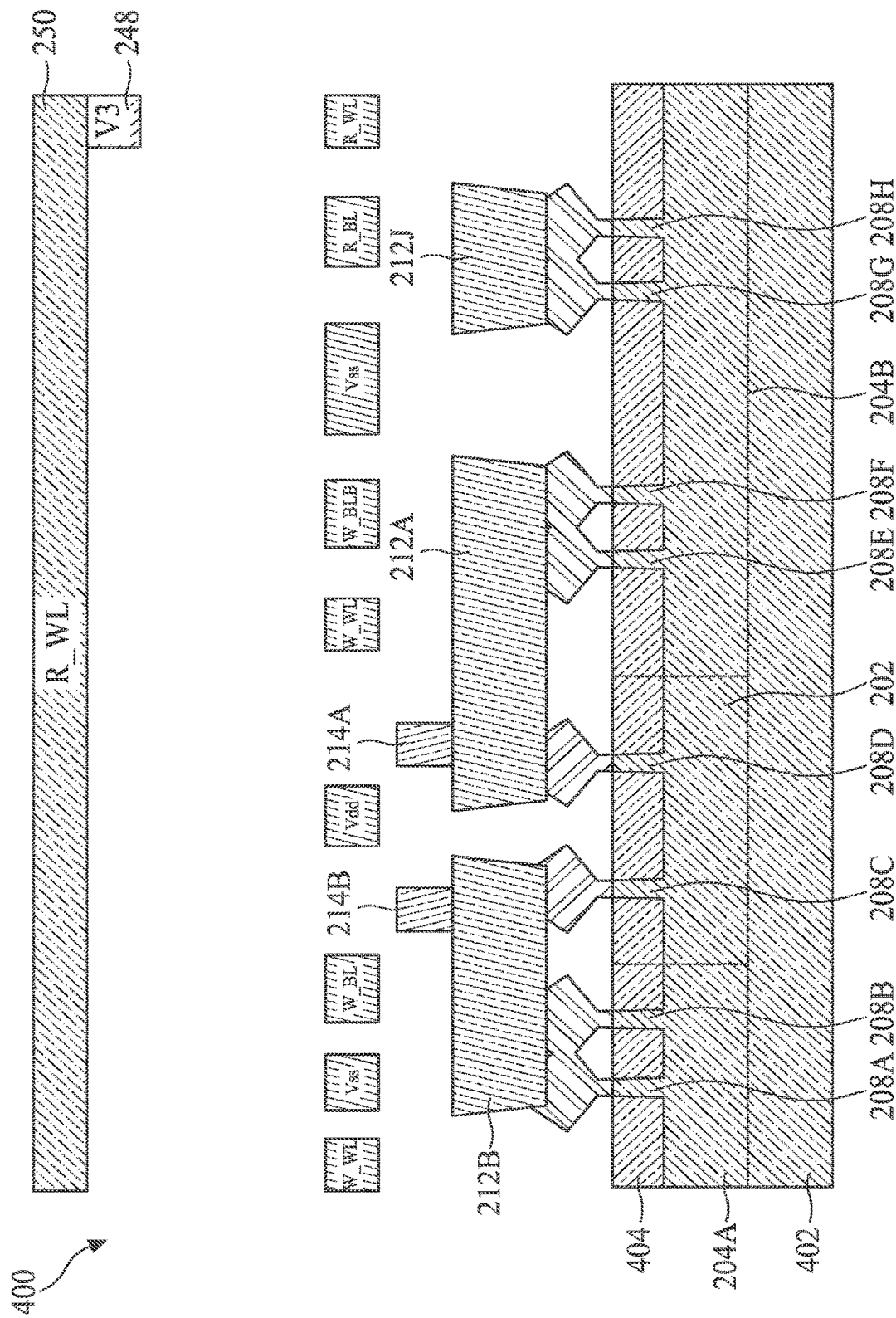
Figure 4C:
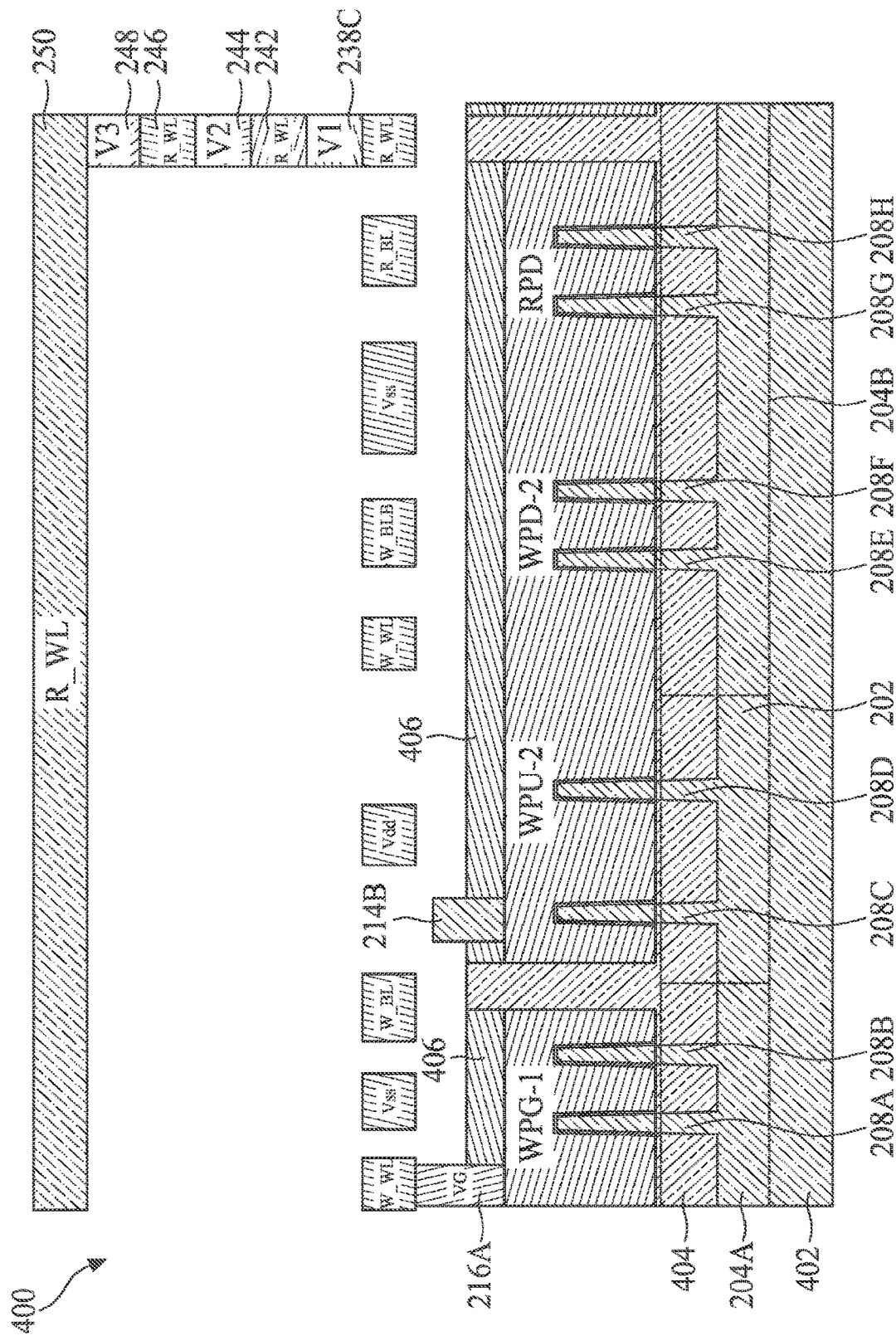
Figure 4D:
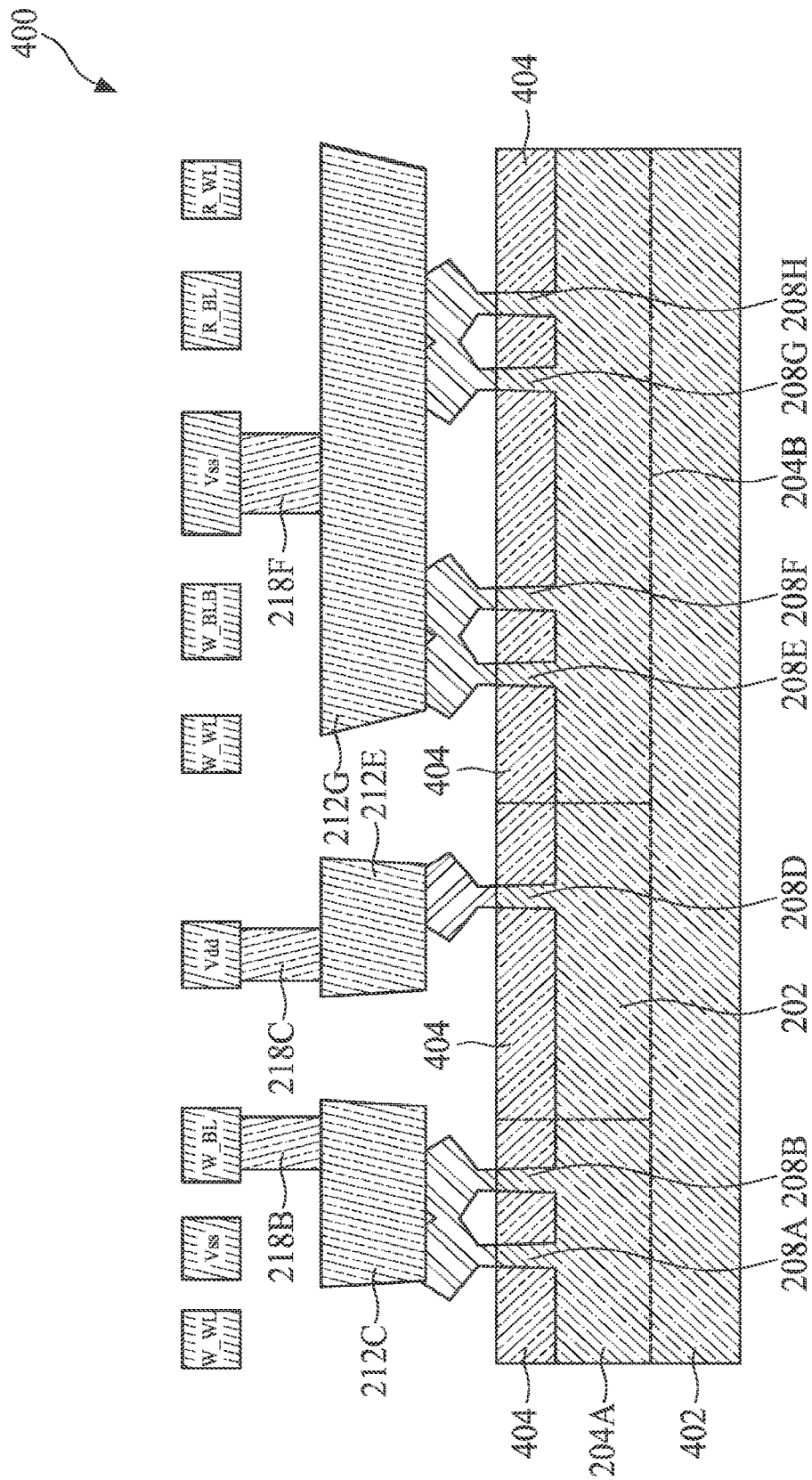
Figure 4E:
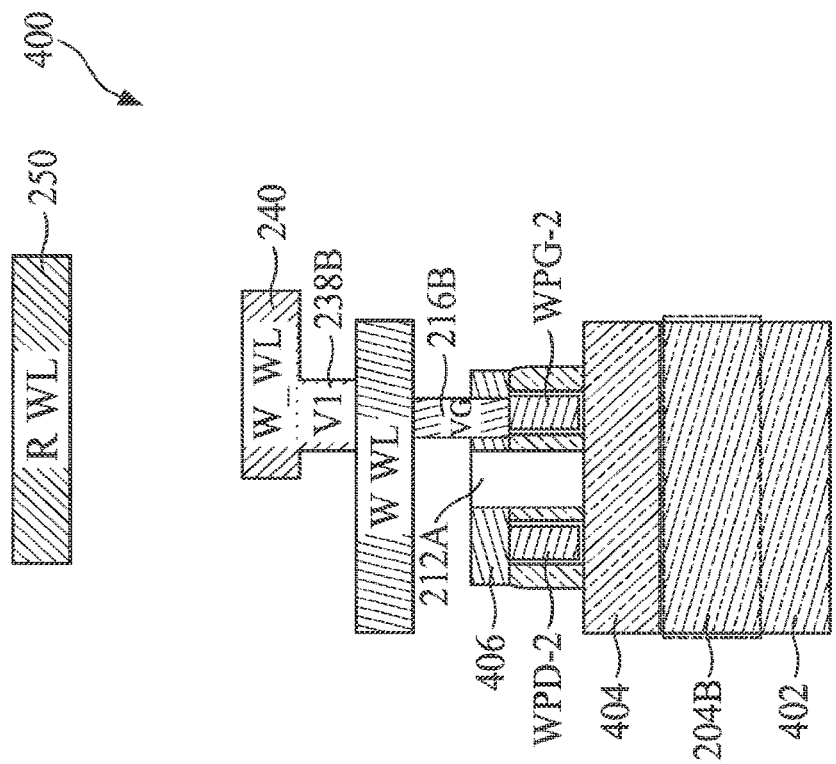

FIG. 2 illustrates a top view of an exemplary two-port SRAM cell layout 200 of the two-port SRAM cell 100 in accordance with various aspects of the present disclosure. FIGS. 3A-3C illustrate top views of individual layers of two-port SRAM cell layout 200. FIG. 3A illustrates front-end features including a substrate, active device regions, gate structures, and contacts, FIG. 3B illustrates middle-of-line features including gate vias, source/drain (S/D) vias, and first metal layer, and FIG. 3C illustrates back-end features including a metal two layer, a metal three layer, a metal four layer, and vias connecting each of the metal layers. FIGS. 4A-4E illustrate diagrammatic cross-sectional views of two-port SRAM cell layout 200 according to various aspects of the present disclosure. FIG. 4A illustrates a diagrammatic cross-sectional view of two-port SRAM cell layout 200 along line A-A of FIG. 2. FIG. 4B illustrates a diagrammatic cross-sectional view of two-port SRAM cell layout 200 along line B-B of FIG. 2. FIG. 4C illustrates a diagrammatic cross-sectional view of two-port SRAM cell layout 200 along line C-C of FIG. 2. FIG. 4D illustrates a diagrammatic cross-sectional view of two-port SRAM cell layout 200 along line D-D of FIG. 2. FIG. 4E illustrates a diagrammatic cross-sectional view of two-port SRAM cell layout 200 along line E-E of FIG. 2.

Turning to FIG. 3A, illustrated are front-end features of two-port SRAM cell layout 200 including the substrate, the active device regions, the gate structures, and contacts. Two-port SRAM cell layout 200 includes a substrate (wafer). In some embodiments, the substrate includes silicon. Alternatively, or additionally, the substrate may include another elementary element, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

An n-well region 202 and p-well regions 204A, 204B are disposed in the substrate with a first p-well region 204A disposed on the left side of n-well region 202 and a second p-well region 204B disposed on the right side of n-well region 202. N-type doped regions, such as n-well region 202, are doped with n-type dopants such as phosphorus, arsenic, other n-type dopants, or combinations thereof. P-type doped regions, such as p-well regions 204A, 204B, are doped using p-type dopants such as boron, indium, other p-type dopants, or combinations thereof. The various doped regions can be formed directly on and/or in the substrate, for example, providing a p-well structure, an n-well structure, a dual-well structure, a raised structure, or combinations thereof. An ion implantation process, a diffusion process, and/or other suitable doping process can be performed to form the various doped regions. Outer boundaries 206A, 206B, 206C, and 206D of two-port SRAM cell layout 200 are illustrated using dashed lines, which mark a rectangular region.

Active regions 208A-208H are disposed over the substrate. Active regions 208A, 208B are disposed over first p-well region 204A, active regions 208C, 208D are disposed over n-well region 202, and active regions 208E, 208F, 208G, 208H are disposed over second p-well region 204B. In some embodiments, active regions 208A-208H include channel regions disposed between source/drain regions of a fin field-effect transistor (FinFET). In some embodiments, the channel regions and/or the source/drain regions are formed in fins of the FinFET. In some embodiments, active regions 208A-208H include channel regions disposed between source/drain regions of a gate-all-around (GAA) device. In some embodiments, the channel regions are disposed in suspended semiconductor layers of the GAA device, such as nanosheet channel(s), nanowire channel(s), bar-shaped channel(s), and/or other suitable configurations. As illustrated in FIG. 3A, each transistor device may include one or more active regions 208A-208H.

Gate electrode 210A forms write pass-gate transistor WPG-1 with the underlying active regions 208A, 208B in first p-well region 204A. Gate electrode 210B forms write pull-down transistor WPD-1 with the underlying active regions 208A, 208B in the first p-well region 204A. Gate electrode 210B further forms write pull-up transistor WPU-1 with the underlying active region 208C in n-well region 202. Gate electrode 210C forms write pull-up transistor WPU-2 with underlying active region 208D in n-well region 202. Gate electrode 210C further forms write pull-down transistor WPD-2 with underlying active regions 208E, 208F in second p-well region 204B. Gate electrode 210C further forms read pull-down transistor RPD with underlying active regions 208G, 208H in second p-well region 204B. Gate electrode 210D forms write pass-gate transistor WPG-2 with underlying active regions 208E, 208F in second p-well region 204B. Gate electrode 210E forms read pass-gate transistor RPG with underlying active regions 208G, 208H in second p-well region 204B. In some embodiments, pull-up transistors WPU-1 and WPU-2, pull-down transistors WPD-1, WPD-2, and RPD, and pass-gate transistors WPG-1, WPG-2, and RPG may be FinFET devices. In some embodiments, pull-up transistors WPU-1 and WPU-2, pull-down transistors WPD-1, WPD-2, and RPD, and pass-gate transistors WPG-1, WPG-2, and RPG may be GAA devices having nanosheet channel(s), nanowire channel(s), bar-shaped channel(s), and/or other suitable configurations.

SD node 102 includes a source/drain (S/D) contact 212A and a gate contact 214A. S/D contact 212A is elongated and has a longitudinal direction in the X direction, which is parallel to the extending directions of gate electrodes 210A-210E. Gate contact 214A has a longitudinal direction in the Y direction, which is perpendicular to the X direction. Gate contact 214A includes a portion over, and electrically coupled to, both S/D contact 212A and gate electrode 210B. In some embodiments, S/D contact 212A and gate contact 214A may be formed as a single continuous, or butted, contact. In some embodiments, S/D contact 212A and gate contact 214A may be formed in separate processes to form a butted contact.

SD node 104 includes a S/D contact 212B and a gate contact 214B. S/D contact 212B is elongated and has a longitudinal direction in the X direction. Gate contact 214B has a longitudinal direction in the Y direction. Gate contact 214B includes a portion over, and electrically coupled to both S/D contact 212B and gate electrode 210C. In some embodiments, S/D contact 212B and gate contact 214B may be formed in a single process as a single continuous, or butted, contact. In some embodiments, S/D contact 212B and gate contact 214B may be formed in separate processes to form a butted contact.

S/D contact 212C connects the source region of write pass-gate transistor WPG-1 to write bit-line W_BL 106 at W_BL Node. S/D contact 212D connects the source region of write pull-down transistor WPD-1 to Vss node 116. S/D contact 212E connects the source region of write pull-up transistor WPU-2 to Vdd node 114. S/D contact 212F connects the source region of write pull-up transistor WPU-1 to Vdd node 112. S/D contact 212G connects the source regions of write pull-down transistor WPD-2 and read pull-down transistor RPD to Vss node 118 and Vss node 117. S/D contact 212H connects the source region of write pass-gate transistor WPG-2 to write bit-line bar W_BLB 108. S/D contact 212I connects the drain region of read pass-gate transistor RPG to read bit-line R_BL 110. S/D contact 212J connects the drain region of the read pull-down transistor RPD to the source region of the read pass-gate transistor RPG. S/D contacts 212C-212J are elongated and have a longitudinal direction in the X direction, parallel to gate electrodes 210A-210E. In some embodiments, one or more elongated S/D contacts 212A-212J may further extend into neighboring SRAM cells that abut SRAM cell 200.

Turning to FIG. 3B, illustrated are additional features of two-port SRAM cell layout 200 including gate vias, source/drain (S/D) vias, and conductive lines (collectively referred to as a metal one (M1) layer). These features may be disposed in one or more inter-layer dielectric layers to form interconnect structures. For the sake of clarity, the front-end features illustrated in FIG. 3A are not illustrated in FIG. 3B, while the front-end features still exist, as illustrated in FIG. 2. Gate vias 216A-216C and S/D vias 218A-218G are illustrated using a circle and a "x" sign in the circle. Conductive lines 220-236 are illustrated using rectangles. Each gate via 216A-216C is disposed over its respective gate electrode and under its respective M1 layer conductive line 220, 228, 236. Each S/D via 218A-218G is disposed over its respective contact and under its respective M1 layer conductive line 222, 224, 226, 230, 232, 234.

Gate via 216A is disposed over, and electrically coupled to, gate electrode 210A and under, and electrically coupled to, conductive line 220, which corresponds to write word-line W_WL. Gate via 216B is disposed over, and electrically coupled to, gate electrode 210D and under, and electrically coupled to, conductive line 228, which corresponds to write word-line W_WL. Gate via 216C is disposed over, and electrically coupled to, gate electrode 210E and under, and electrically coupled to, conductive line 236, which corresponds to read word-line R_WL.

S/D via 218A is disposed over, and electrically coupled to, S/D contact 212D and under and electrically coupled to, conductive line 222. S/D via 218B is disposed over, and electrically coupled to, contact 212C and under, and electrically coupled to, conductive line 224. S/D via 218C is disposed over, and electrically coupled to, S/D contact 212E and under, and electrically coupled to, conductive line 226. S/D via 218D is disposed over, and electrically coupled to, S/D contact 212F and under, and electrically coupled to, conductive line 226. S/D via 218E is disposed over, and electrically coupled to, S/D contact 212H and under, and electrically coupled to, conductive line 230. S/D via 218F is disposed over, and electrically coupled to, S/D contact 212G and under, and electrically coupled to, conductive line 232. S/D via 218G is disposed over, and electrically coupled to, S/D contact 212I and under, and electrically coupled to, conductive line 234.

Conductive lines 220-236 correspond to the Vdd, Vss, write, and read lines and/or landing pads as described above with respect to FIG. 1. Conductive lines 220-236 extend longitudinally in the Y direction. In some embodiments, conductive lines 220-236 extend into neighboring SRAM cells. In some embodiments, one or more conductive lines 220-236 may be shared with neighboring SRAM cells. Conductive line 220 is a first write word-line landing pad corresponding to write word-line W_WL of write pass-gate transistor WPG-1. Conductive line 222 is a first Vss line corresponding to Vss node 110. Conductive line 224 is a write bit-line corresponding to write bit line W_BL. Conductive line 226 is a first Vdd line corresponding to Vdd node 106. Conductive line 228 is a second write word-line landing pad corresponding to write word-line W_WL of write pass-gate transistor WPG-2. Conductive line 230 is a write bit-line bar corresponding to write bit-line bar W_BLB. Conductive line 232 is a second Vss line corresponding to Vss node 112 and Vss node 114. Conductive line 234 is a read bit-line corresponding to read bit-line R_BL. Conductive line 236 is a read word-line landing pad corresponding to read word-line R_WL of read pass-gate transistor RPG.

Turning to FIG. 3C, illustrated are back-end features of two-port SRAM cell 200 including a metal two (M2) layer, a metal three (M3) layer, a metal four (M4) layer, and vias connecting each of the metal layers. Vias are illustrated using a circle and a "x" sign in the circle. For the sake of clarity, only the conductive lines of M1 layer of the front-end features as shown in FIGS. 3A and 3B are illustrated in FIG. 3C, though the other front-end features still exist, as illustrated in FIG. 2. Via 238A is disposed over, and electrically coupled to, M1 conductive line 220 and under, and electrically coupled to, an M2 conductive line 240, which is write word-line W_WL. Via 238B is disposed over, and electrically coupled to, M1 conductive line 228 and under, and electrically coupled to, M2 conductive line 240. Via 238C is disposed over, and electrically coupled to, M1 conductive line 236 and under, and electrically coupled to, an M2 conductive line 242, which is a read word-line R_WL landing pad. M2 conductive line 240 and M2 conductive line 242 extend longitudinally in the X direction.

Via 244 is disposed over, and electrically coupled to, M2 conductive line 242 and under, and electrically coupled to, M3 conductive line 246, which is a read word-line R_WL landing pad. M3 conductive line 246 extends longitudinally in the Y direction.

Via 248 is disposed over, and electrically coupled to, M3 conductive line 246 and under, and electrically coupled to M4 conductive line 250, which is read word-line R_WL. M4 conductive line 250 extends longitudinally in the X direction.

Turning to FIGS. 4A-4E, illustrated are cross-section views of the two-port SRAM cell layout 200. In addition to the layers different layers previously described with respect to FIGS. 3A-3C, FIGS. 4A-4E further illustrate a substrate 402, n-well 202 disposed in substrate 402, and p-wells 204A, 204B disposed in substrate 402. Active regions 208A-208H extend from substrate 402 within their respective n-well region 202 and p-well regions 204A, 204B. Shallow trench isolation (STI) region 404 is disposed over n-well region 202, p-well regions 204A, 204B, and adjacent a portion of active regions 208A-208H. STI region 404 is further disposed between gate structures 210A-210E. A gate dielectric 406 is disposed over gate structures 210A-210E.

The layout described above, with respect to FIGS. 2-4E, improves the performance of the SRAM cell 100. SRAM cell layout 200 increases the width the n-well as compared to other SRAM cell layouts. Improved patterning techniques allows the gate pickup for the write pass-gate transistor WPG-2 (i.e., word line landing pad (e.g., conductive line 228) and gate via 216B) to be placed between write pull-down transistor WPD-2 (and write pass-gate transistor WPG-2) and write pull-up transistor WPU-2 (and write pull-up transistor WPU-1). This placement creates more space between the Vdd M1 layer and the Vss M1 layer and allows the n-well (e.g., n-well 202) to be wider. Increasing the width of the n-well, the resistance within the n-well is improved and well isolation leakage is improved providing better performance for the overall SRAM cell. The wider n-well may also improve latch-up and soft-error-rate immunity. With this new layout, the Vss M1 line (e.g., conductive line 232) may be wider than previously possible. The wider Vss M1 line lowers the resistance of the Vss line thereby improving overall performance of the SRAM cell. Different improvements may be present in different embodiments.

Figure 5:
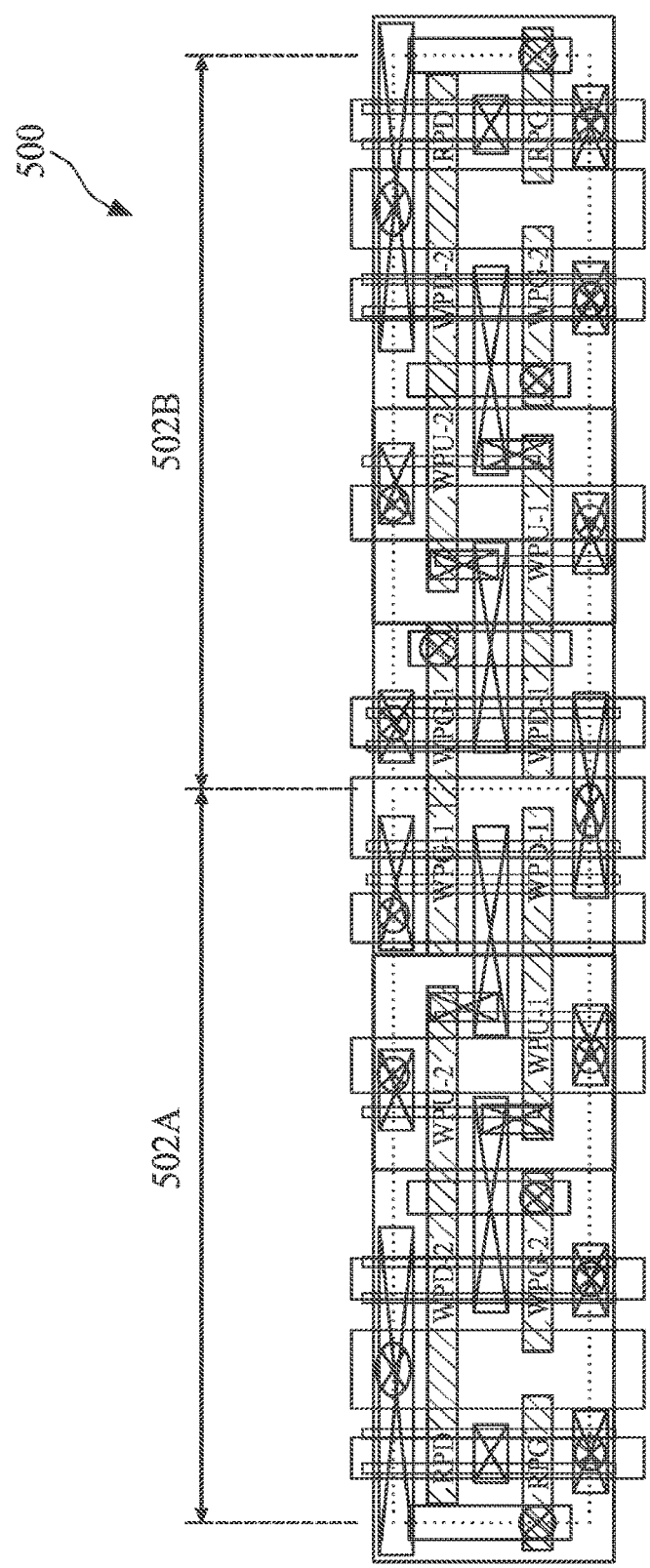
FIG. 5 illustrates a top view of an exemplary layout of two two-port SRAM cells according to various aspects of the present disclosure.
Figure 6A:
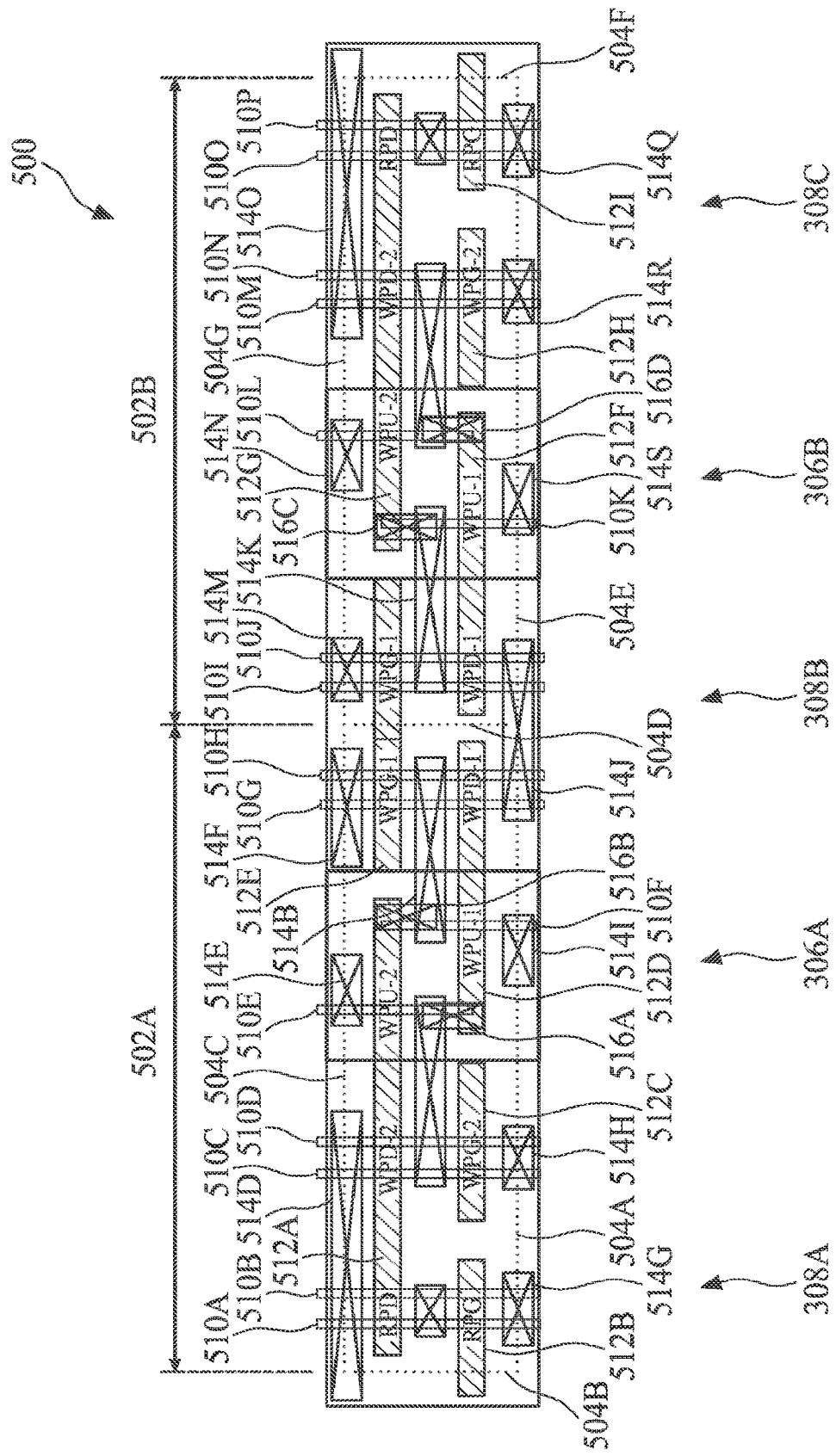
FIGS. 6A-6B illustrate top views of an exemplary layout of individual layers of two two-port SRAM cells according to various aspects of the present disclosure.
Figure 6B:
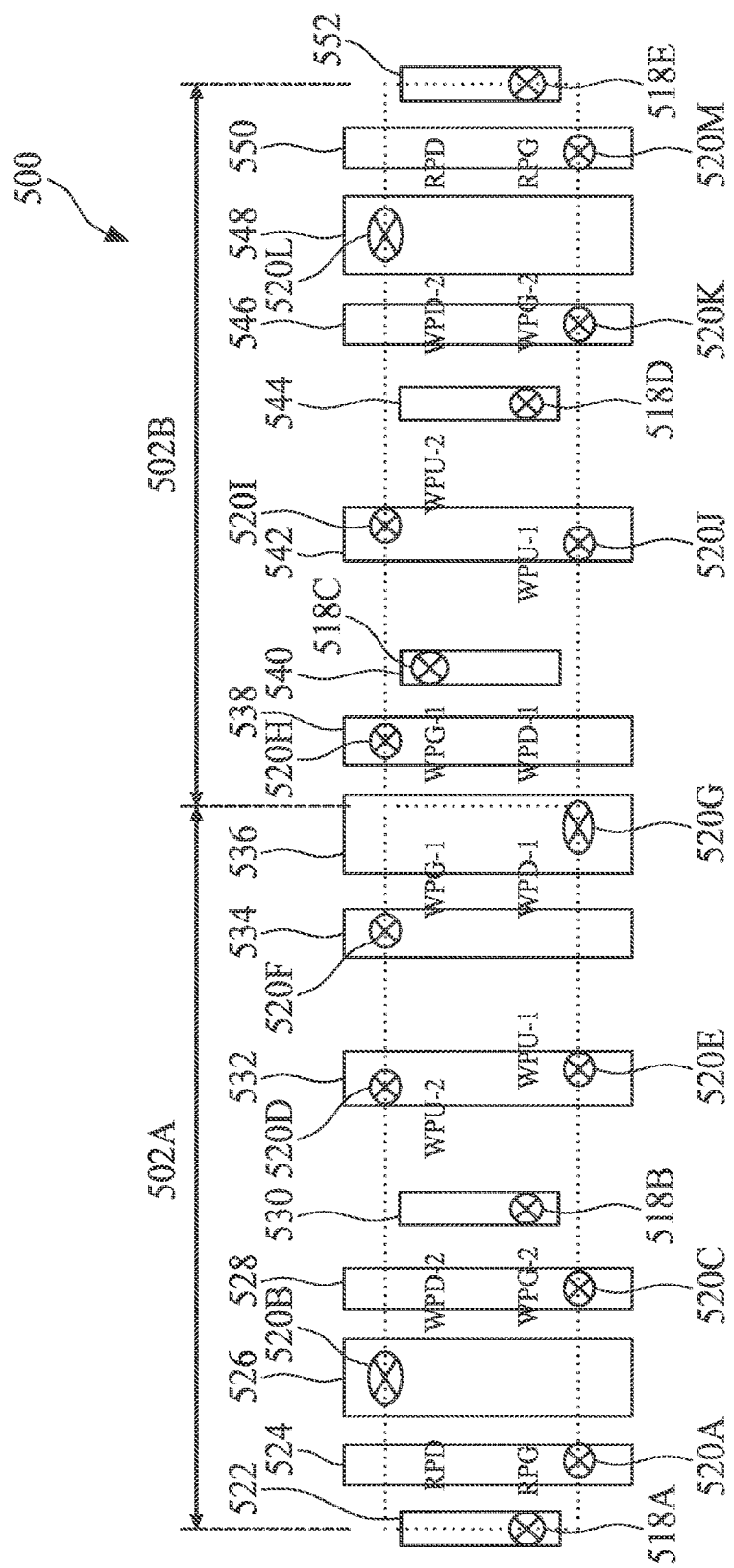

FIG. 5 illustrates a top view of an exemplary two-port SRAM cell layout 500 including two adjacent two-port SRAM cell 100 in accordance with various aspects of the present disclosure. FIGS. 6A and 6B illustrate top views of individual layers of two-port SRAM cell layout 500. FIG. 6A illustrates front-end features including a substrate, active device regions, gate structures, and contacts and FIG. 6B illustrates middle-of-line features including gate vias, source/drain (S/D) vias, and first metal layer. Cross sections of two-port SRAM cell layout 500 are similar to those discussed above with respect to two-port SRAM cell layout 200 in FIGS. 4A-4E.

Turning to FIG. 6A, illustrated are front-end features of two-port SRAM cell layout 500 including a substrate, active device regions, gate structures, and contacts. Two-port SRAM cell layout 500 includes a substrate (wafer). In some embodiments, the substrate includes silicon. Alternatively, or additionally, the substrate may include another elementary element, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Two-port SRAM cell layout 500 illustrates an exemplary configuration having a first SRAM cell 502A and a second SRAM cell 502B with first and second SRAM cells 502A and 502B being adjacent to each other. As will be discussed further below, this configuration allows the cells 502A, 502B to share different front-end features than would be shared using two-port SRAM cell layout 200. Outer boundaries 504A, 504B, 504C, and 504D define first SRAM cell 502A and outer boundaries 504D, 504E, 504F, and 504G define second SRAM cell 502B.

N-well regions 506A and 506B and p-well regions 508A, 508B, and 508C are disposed in the substrate with a first p-well region 508A disposed on the left side of a first n-well region 506A, a second p-well region 508B disposed on the right side of first n-well region 506A, a second n-well region 506B disposed on the right side of second p-well region 508B, and a third p-well region 508C disposed on the right side of second n-well region 506B. First SRAM cell 502A includes first n-well region 506A, first p-well region 508A, and second p-well region 508B. Second SRAM cell 502B includes second n-well region 506B, second p-well region 508B, and third p-well region 508C. N-type doped regions, such as n-well regions 506A, 506B, are doped with n-type dopants such as phosphorus, arsenic, other n-type dopants, or combinations thereof. P-type doped regions, such as p-well regions 508A-808C, are doped using p-type dopants such as boron, indium, other p-type dopants, or combinations thereof. The various doped regions can be formed directly on and/or in the substrate, for example, providing a p-well structure, an n-well structure, a dual-well structure, a raised structure, or combinations thereof. An ion implantation process, a diffusion process, and/or other suitable doping process can be performed to form the various doped regions.

Active regions 510A-510P are disposed over the substrate. Active regions 510A-510D are disposed over first p-well region 508A, active regions 510E, 510F are disposed over first n-well region 506A, active regions 510G-510J are disposed over second p-well region 508B, active regions 510K, 510L are disposed over second n-well region 506B, and active regions 510M-510P are disposed over third p-well region 508C. In some embodiments, active regions 510A-510P include channel regions disposed between source/drain regions of a fin field-effect transistors (FinFET). In some embodiments, the channel regions and/or the source/drain regions are formed in fins of the FinFET. In some embodiments, active regions 510A-510P include channel regions disposed between source/drain regions of a gate-all-around (GAA) device. In some embodiments, the channel regions are disposed in suspended semiconductor layers of the GAA device, such as nanosheet channel(s), nanowire channel(s), bar-shaped channel(s), and/or other suitable configurations. As illustrated in FIG. 2A, each transistor device may include one or more active regions 510A-510P.

First SRAM cell 502A includes gate electrodes 512A-512E. Gate electrode 512A forms read pull-down transistor RPD with the underlying active regions 510A, 510B in first p-well region 508A. Gate electrode 512A further forms write pull-down transistor WPD-2 with the underlying active regions 510C, 510D in first p-well region 508A. Gate electrode 512A further forms write pull-up transistor WPU-2 with the underlying active region 510E in first n-well region 506A. Gate electrode 512B forms read pass-gate transistor RPG with the underlying active regions 510A, 510B in first p-well region 508A. Gate electrode 512C forms write pass-gate transistor WPG-2 with the underlying active regions 510C, 510D in first p-well region 508A. Gate electrode 512D forms write pull-up transistor WPU-1 with the underlying active region 510F in first n-well region 506A. Gate electrode 512D further forms write pull-down transistor WPD-1 with the underlying active regions 510G, 510H in second p-well region 508B. Gate electrode 512E forms write pass-gate transistor WPG-1 of first SRAM cell 502A with the underlying active regions 510G, 510H in second p-well region 508B.

Second SRAM cell 502B includes gate electrodes 512E-512I. Gate electrode 512E further forms write pass-gate transistor WPG-1 of second SRAM cell 502B with the underlying active regions 510I, 510J in second p-well region 508B. Gate electrode 512F forms write pull-down transistor WPD-1 with the underlying active regions 510I, 510J in second p-well region 508B. Gate electrode 512F further forms write pull-up transistor WPU-1 with the underlying active region 510K in second n-well region 506B. Gate electrode 512G forms write pull-up transistor WPU-2 with the underlying active region 510L in second n-well region 506B. Gate electrode 512G further forms write pull-down transistor WPD-2 with the underlying active regions 510M, 510N in third p-well region 508C. Gate electrode 512G further forms read pull-down transistor RPD with the underlying active regions 510O, 510P in third p-well region 508C. Gate electrode 512H forms write pass-gate transistor WPG-2 with the underlying active regions 510M, 510N in third p-well region 508C. Gate electrode 512I forms read pass-gate transistor RPG with the underlying active regions 510O, 510P in third p-well region 508C.

In some embodiments, pull-up transistors WPU-1 and WPU-2, pull-down transistors WPD-1, WPD-2, and RPD, and pass-gate transistors WPG-1, WPG-2, and RPG may be FinFET devices. In some embodiments, pull-up transistors WPU-1 and WPU-2, pull-down transistors WPD-1, WPD-2, and RPD, and pass-gate transistors WPG-1, WPG-2, and RPG may be GAA devices having nanosheet channel(s), nanowire channel(s), bar-shaped channel(s), and/or other suitable configurations.

Beginning with first SRAM cell 502A, a SD node includes a source/drain (S/D) contact 514A and a gate contact 516A. S/D contact 514A is elongated and has a longitudinal direction in the X direction, which is parallel to the extending directions of gate electrodes 512A-512I. Gate contact 516A has a longitudinal direction in the Y direction, which is perpendicular to the X direction. Gate contact 516A includes a portion over, and electrically coupled to, both S/D contact 514A and gate electrode 512D. In some embodiments, S/D contact 514A and gate contact 516A may be formed as a single continuous, or butted, contact. In some embodiments, S/D contact 514A and gate contact 516A may be formed in separate processes to form a butted contact.

A SD node of first SRAM cell 502A includes an S/D contact 514B and a gate contact 516B. S/D contact 514B is elongated and has a longitudinal direction in the X direction. Gate contact 516B has a longitudinal direction in the Y direction. Gate contact 516B includes a portion over, and electrically coupled to both S/D contact 514B and gate electrode 512A. In some embodiments, S/D contact 514B and gate contact 516B may be formed in a single process as a single continuous, or butted, contact. In some embodiments, S/D contact 514B and gate contact 516B may be formed in separate processes to form a butted contact.

Continuing with first SRAM cell 502A, S/D contact 514C connects the drain region of read pull-down transistor RPD to a source/drain region of read pass-gate transistor RPG. S/D contact 514D connects a source region of read pull-down transistor RPD and the source region of write pull-down transistor WPD-2 to a power line at a first Vss node and a second Vss node, respectively. S/D contact 514E connects a source region of write pull-up transistor WPU-2 to a power line at Vdd node 108. S/D contact 514F connects a source/drain region of write pass-gate transistor WPG-1 to write bit-line W_BL. S/D contact 514G connects a source/drain region of read pass-gate transistor RPG to read bit-line R_BL. S/D contact 514H connects a source/drain region of write pass-gate transistor WPG-2 to word bit-line bar W_BLB. S/D contact 514I connects a source region of write pull-up transistor WPU-1 to a power line at a first Vdd node. S/D contact 514J connects a source region of write pull-down transistor WPD-1 to a power line at a third Vss node. S/D contact 514J extends from first SRAM cell 502A and into second SRAM cell 502B, further connecting write pull-down transistor WPD-1 of second SRAM cell 502B to a power line at the third Vss node.

Turning to second SRAM cell 502B, a SD node includes a source/drain (S/D) contact 514K and a gate contact 516C. S/D contact 514K is elongated and has a longitudinal direction in the X direction. Gate contact 516C has a longitudinal direction in the Y direction. Gate contact 516C includes a portion over, and electrically coupled to, both S/D contact 514K and gate electrode 512G. In some embodiments, S/D contact 514K and gate contact 516C may be formed as a single continuous, or butted, contact. In some embodiments, S/D contact 514K and gate contact 516C may be formed in separate processes to form a butted contact.

A SD node of second SRAM cell 502B includes an S/D contact 514L and a gate contact 516D. S/D contact 514L is elongated and has a longitudinal direction in the X direction. Gate contact 516D has a longitudinal direction in the Y direction. Gate contact 516D includes a portion over, and electrically coupled to both S/D contact 514L and gate electrode 512F. In some embodiments, S/D contact 514K and gate contact 516D may be formed in a single process as a single continuous, or butted, contact. In some embodiments, S/D contact 514L and gate contact 516D may be formed in separate processes to form a butted contact.

Continuing with second SRAM cell 502B, S/D contact 514J connects a source region of write pull-down transistor WPD-1 to a power line at a fourth Vss node. As discussed above, S/D contact 514J extends from first SRAM cell 502A into second SRAM cell 502B. S/D contact 514M connects a source/drain region of write pass-gate transistor WPG-1 to write bit-line W_BL. S/D contact 514N connects a source region of write pull-up transistor WPU-2 to a power line at a second Vdd node. S/D contact 514O connects a source region of read pull-down transistor RPD and the source region of write pull-down transistor WPD-2 to a power line at a fifth Vss node and a sixth Vss node, respectively. S/D contact 514P connects the drain region of read pull-down transistor RPD to a source/drain region of read pass-gate transistor RPG.

S/D contact 514Q connects a source/drain region of read pass-gate transistor RPG to read bit-line R_BL. S/D contact 514R connects a source/drain region of write pass-gate transistor WPG-2 to word bit-line bar W_BLB. S/D contact 514S connects a source region of write pull-up transistor WPU-1 to a power line at a second Vdd node.

Turning to FIG. 6B, illustrated are additional features of two-port SRAM multiple cell layout 500 including gate vias, source/drain (S/D) vias, and conductive lines (collectively referred to as metal one (M1) layer). These features may be disposed in one or more inter-layer dielectric layers to form interconnect structures. For the sake of clarity, the front-end features illustrated in FIG. 6A are not illustrated in FIG. 6B, while the front-end features still exist, as illustrated in FIG. 5. Gate vias 518A-518E and S/D vias 520A-520M are illustrated using a circle and a "x" sign in the circle. Conductive lines 522-552 are illustrated using rectangles. Each of gate via 518A-518E is disposed over its respective gate electrode and under its respective M1 layer conductive line 522, 530, 540, 544, 552. Each S/D via 520A-520M is disposed over its respective contact and under its respective M1 layer conductive line 524, 526, 528, 532, 534, 536, 538, 542, 546, 548, 550.

Gate via 518A is disposed over, and electrically coupled to, gate electrode 512B and under and electrically coupled to conductive line 522 which corresponds to a read word-line R_WL landing pad of two-port SRAM cell 502A. Gate via 518B is disposed over, and electrically coupled to, gate electrode 512C and under and electrically coupled to conductive line 530, which corresponds to a write word-line W_WL landing pad of two-port SRAM cell 502A. Gate via 518C is disposed over, and electrically coupled to, gate electrode 512E and under and electrically coupled to conductive line 540, which corresponds to a write word-line W_WL landing pad of two-port SRAM cell 502B. Gate via 518D is disposed over, and electrically coupled to, gate electrode 512H and under and electrically coupled to conductive line 544, which corresponds to a write word-line W_WL landing pad of two-port SRAM cell 502B. Gate via 518E is disposed over, and electrically coupled to, gate electrode 512I and under and electrically coupled to conductive line 552, which corresponds to read word-line R_WL landing pad of two-port SRAM cell 502B. Accordingly, SRAM cell 502B includes two write word-line landing pads (e.g., 540, 544) and one read word-line landing pad (e.g., 552), and SRAM cell 502A includes one write word-line landing pad (e.g., 530) and one read word-line landing pad (e.g., 522). The read word-line landing pads are located on cell boundaries, and the write word-line landing pads are located within cell boundaries.

S/D via 520A is disposed over, and electrically coupled to, S/D contact 514G and under, and electrically coupled to, conductive line 524, which corresponds to a read bit-line R_BL of two-port SRAM cell 502A. S/D via 520B is disposed over, and electrically coupled to, S/D contact 514D and under, and electrically coupled to, conductive line 526, which corresponds to a first Vss line of two-port SRAM cell 502A. S/D via 520C is disposed over, and electrically coupled to, S/D contact 514H and under, and electrically coupled to, conductive line 528, which corresponds with a write bit-line bar W_BLB of two-port SRAM cell 502A. S/D via 520D is disposed over, and electrically coupled to, S/D contact 514E and under, and electrically coupled to, conductive line 532, which corresponds to a Vdd line of two-port SRAM cell 502A. S/D via 520E is disposed over, and electrically coupled to, S/D contact 514I and under, and electrically coupled to, conductive line 532 which corresponds to the first Vdd line of two-port SRAM cell 502A. S/D via 520F is disposed over, and electrically coupled to, S/D contact 514F and under, and electrically coupled to, conductive line 534, which corresponds to a write bit-line W_BL of two-port SRAM cell 502A. S/D via 520G is disposed over, and electrically coupled to, S/D contact 514J and under, and electrically coupled to, conductive line 536, which corresponds to a second Vss line that is shared between of two-port SRAM cells 502A and 502B. S/D via 520H is disposed over, and electrically coupled to, S/D contact 514M and under, and electrically coupled to, conductive line 538, which corresponds to write bit-line W_BL of two-port SRAM cell 502B. S/D via 520I is disposed over, and electrically coupled to, S/D contact 514N and under, and electrically coupled to, conductive line 542, which corresponds to a Vdd line of two-port SRAM cell 502B. S/D via 520J is disposed over, and electrically coupled to, S/D contact 514S and under, and electrically coupled to, conductive line 542, which corresponds to the Vdd line of two-port SRAM cell 502B. S/D via 520K is disposed over, and electrically coupled to, S/D contact 514R and under, and electrically coupled to, conductive line 546, which corresponds to write bit-line bar W_BLB of two-port SRAM cell 502B. S/D via 520L is disposed over, and electrically coupled to, S/D contact 514O and under, and electrically coupled to, conductive line 548, which corresponds to a third Vss line of two-port SRAM cell 502B. S/D via 520M is disposed over, and electrically coupled to, S/D contact 514Q and under, and electrically coupled to, conductive line 550, which corresponds to a read bit-line R_BL of two-port SRAM cell 502B.

Conductive lines (i.e., 522, 524, 526, 528, 530, 532, 534, 536, 538, 540, 542, 544, 546, 548, 550, 552) of the metal one layer have a longitudinal direction in the Y direction, which is substantially parallel to a lengthwise direction of active regions 510A-510P and substantially perpendicular to a lengthwise direction of gate structures 512A-512I. Landing pads (e.g., 522, 530, 540, 544, 552) in the M1 layer are shorter than bit lines (e.g., 524, 528, 534, 538, 546, 550), and voltage lines (e.g., 526, 532, 542, 548) in the M1 layer. In FIG. 6A and FIG. 6B, for example, landing pads have lengths that are less than a width of SRAM cells 502A, 502B, while the bit lines and the voltage lines have lengths that are greater than the width of SRAM cells 502A, 502B. In some embodiments, the bit lines and the voltage lines are shared by more than one SRAM cell, such as SRAM cells in a same row. SRAM cell 502A and SRAM cell 502B each have a write word-line landing pad located between a write bit-line bar and a Vdd line. For example, SRAM cell 502A has a write word-line W_WL landing pad (e.g., 530) located between its write bit-line W_BLB (e.g., 528) and its Vdd line (e.g., 532) (or, put another way, located between its write pull-down transistor WPD-2 and write pull-up transistor WPU-2) and SRAM cell 502B has a write word-line W_WL landing pad (e.g., 540) located between its write bit-line W_BL (e.g., 546) and its Vdd line (e.g., 542) (or, put another way, located between write pull-down transistor WPD-2 and write pull-up transistor WPU-2). SRAM cell 502B further includes a write word-line W_WL landing pad (e.g., 540) located between its write bit-line W_BL (e.g., 538) and its Vdd line (e.g., 542) (or, put another way, located between write pull-down transistor PD-1 and write pull-up transistor PU-1). Further, SRAM cell 502A and SRAM cell 502B each have a Vss line located between a write bit-line bar and a read bit-line. For example, SRAM cell 502A has Vss line (e.g., 526) located between its read bit-line R_BL (e.g., 524) and its write bit-line bar W_BLB (e.g., 528), and SRAM cell 502B has Vss line (e.g., 543) located between its read bit-line R_BL (e.g., 550) and its write bit-line bar W_BLB (e.g., 546). As noted above, SRAM cell 502A and SRAM cell 502B further share a Vss line (e.g., 536), which is located between write bit-lines of the adjacent SRAM cells, such as write bit-line W_BL (e.g., 534) of SRAM cell 502A and write bit-line W_BL (e.g., 538) of SRAM cell 502B.

Back-end features of two-port SRAM cell layout 500 include a metal two (M2) layer, a metal three (M3) layer, a metal four (M4) layer, and vias connecting each of the metal layers, similar to those described above with respect to FIG. 3C. A via is disposed over, and electrically coupled to, M1 conductive line 522 and under, and electrically coupled to, a first portion of a first M2 conductive line which is read word-line R_WL landing pad. A via is disposed over, and electrically coupled to, M1 conductive line 530 and under, and electrically coupled to, a second M2 conductive line which is a write word-line W_WL. A via is disposed over, and electrically coupled to, M1 conductive line 540 and under, and electrically coupled to, the second M2 conductive line which is write word-line W_WL. A via is disposed over, and electrically coupled to, M1 conductive line 544 and under, and electrically coupled to, the second M2 conductive line which is write word-line W_WL. A via is disposed over, and electrically coupled to, M1 conductive line 552 and under, and electrically coupled to, a second portion of the first M2 conductive line which is the read word-line R_WL landing pad. The first and second M2 conductive lines extend longitudinally in the X direction.

A via is disposed over, and electrically coupled to, the first portion of the first M2 conductive line and under, and electrically coupled to, a first M3 conductive line, which is a read word-line R_WL landing pad. A via is disposed over, and electrically coupled to, the second portion of the first M2 conductive line and under, and electrically coupled to, a second M3 conductive line, which is a read word-line R_WL landing pad. The M3 conductive line extends longitudinally in the Y direction.

A via is disposed over, and electrically coupled to, the first M3 conductive line and under, and electrically coupled to, a M4 conductive line which is a read word-line R_WL. A via is disposed over, and electrically coupled to, the second M3 conductive line and under, and electrically coupled to, the M4 conductive line which is the read word-line R_WL. The M4 conductive line extends longitudinally in the X direction.

Figure 7:
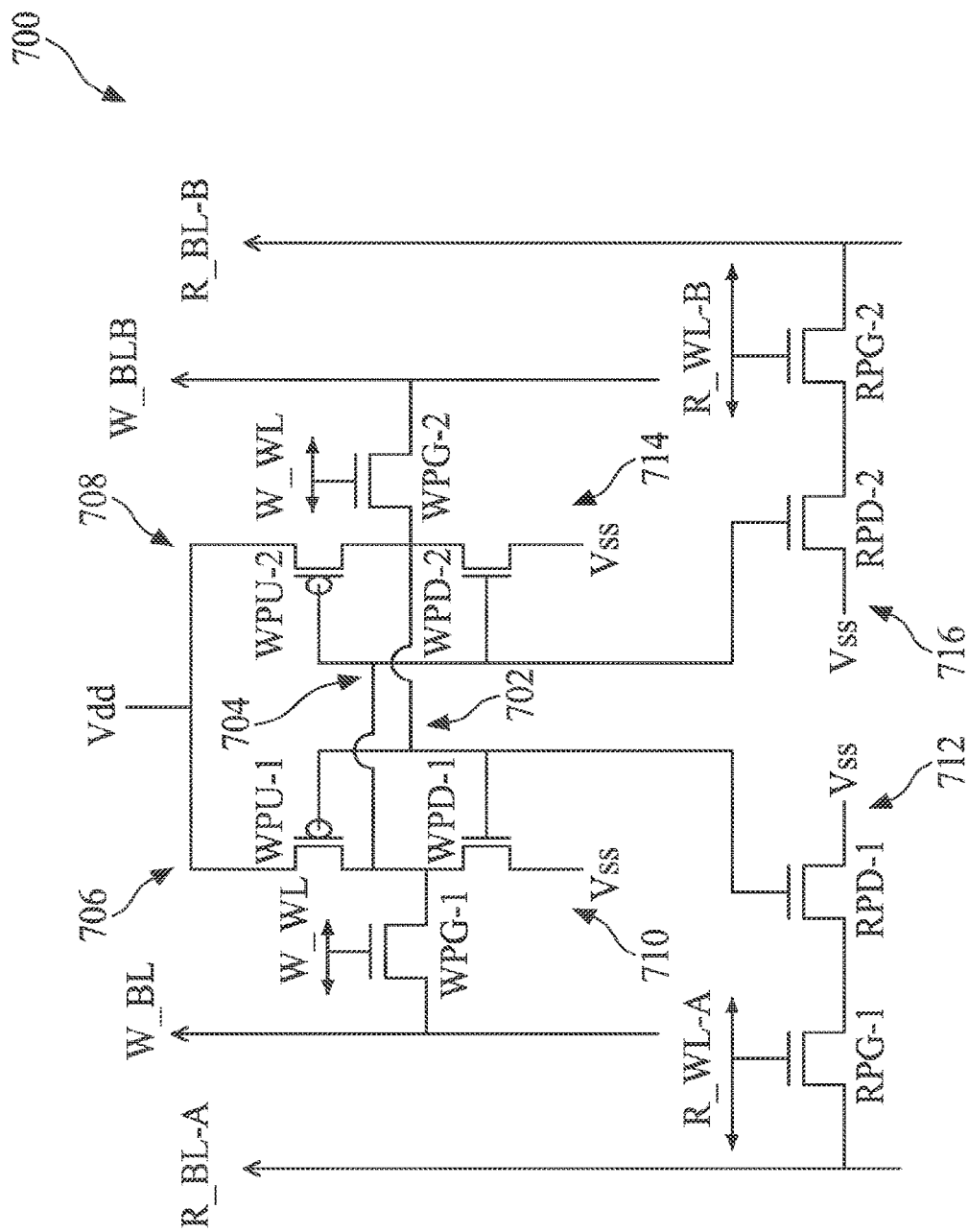
FIG. 7 illustrates a circuit diagram of a three-port SRAM cell according to various aspects of the present disclosure.

FIG. 7 illustrates a circuit diagram of a three-port SRAM cell 700 in accordance with some embodiments of the present disclosure. Three-port SRAM cell 700 includes 10 transistor devices and is able to make one read and one write within a single clock cycle. SRAM cell 700 includes pull-up transistors WPU-1 and WPU-2, which are P-type Metal-Oxide-Semiconductor (PMOS) transistors, and pull-down transistors WPD-1, WPD-2, RPD-1, and RPD-1 and pass-gate transistors WPG-1, WPG-2, RPG-1, and RPG-2 which are N-type Metal-Oxide-Semiconductor (NMOS) transistors. The gates of the pass-gate transistors WPG-1 and WPG-2 are controlled by word-line W_WL that determines whether or not SRAM cell 700 is selected for writing. The pass-gate transistors RPG-1 and RPG-2 are controlled by word-line R_WL-A and R_WL-B respectively, which determine whether or not SRAM cell 700 is selected for reading. A latch formed of pull-up transistors WPU-1 and WPU-2 and pull-down transistors WPD-1 and WPD-2 stores a bit, wherein the complementary values of the bit are stored in Storage Data (SD) node 702 and SD node 704. The stored bit can be written into SRAM cell 700 through complementary bit lines including write bit-line W_BL and write bit-line bar W_BLB. The stored bit can be read from SRAM cell 700 through either read bit-line A R_BL-A or read bit-line B R_BL-B. SRAM cell 700 is powered through a positive power supply node Vdd that has a positive power supply voltage (also denoted as VDD). SRAM cell 700 is also connected to power supply voltage Vss (also denoted as VSS), which may be an electrical ground. Transistors WPU-1 and WPD-1 form a first inverter. Transistors WPU-2 and WPD-2 form a second inverter. The input of the first inverter is connected to transistor WPG-1 and the output of the second inverter. The output of the first inverter is connected to transistor WPG-2 and the input of the second inverter. The output of the first inverter controls the read pull-down transistor RPD-1. The output of the second inverter controls the read pull-down transistor RPD-2.

The sources of pull-up transistors WPU-1 and WPU-2 are connected to Vdd node 706 and Vdd node 708, respectively, which are further connected to power supply voltage (and line) Vdd. The sources of pull-down transistors WPD-1 and WPD-2 are connected to Vss node 710 and Vss node 714, respectively, which are further connected to power supply voltage/line Vss. The source of pull-down transistors RPD-1 and RPD-2 are connected to Vss node 712 and Vss node 716, respectively, which are further connected to power supply voltage/line Vss. The drain of pull-down transistor RPD-1 is connected to a source/drain region of pass-gate transistor RPG-1. The drain of pull-down transistor RPD-2 is connected to a source/drain region of pass-gate transistor RPG-2. The gates of transistors WPU-1 and WPD-1 are connected to the drains of transistors WPU-2 and WPD-2, which form a connection node that is referred to as SD node 702. The gates of transistors WPU-2, WPD-2, and RPD are connected to the drains of transistors WPU-1 and WPD-1, which connection node is referred to as SD node 704. A source/drain region of pass-gate transistor WPG-1 is connected to write bit-line W_BL. A source/drain region of pass-gate transistor WPG-2 is connected to write bit-line W_BLB. A source/drain region of pass-gate transistor RPG-1 is connected to read bit-line R_BL-A. A source/drain region of pass-gate transistor RPG-2 is connected to read bit-line R_BL-B.

Figure 8:
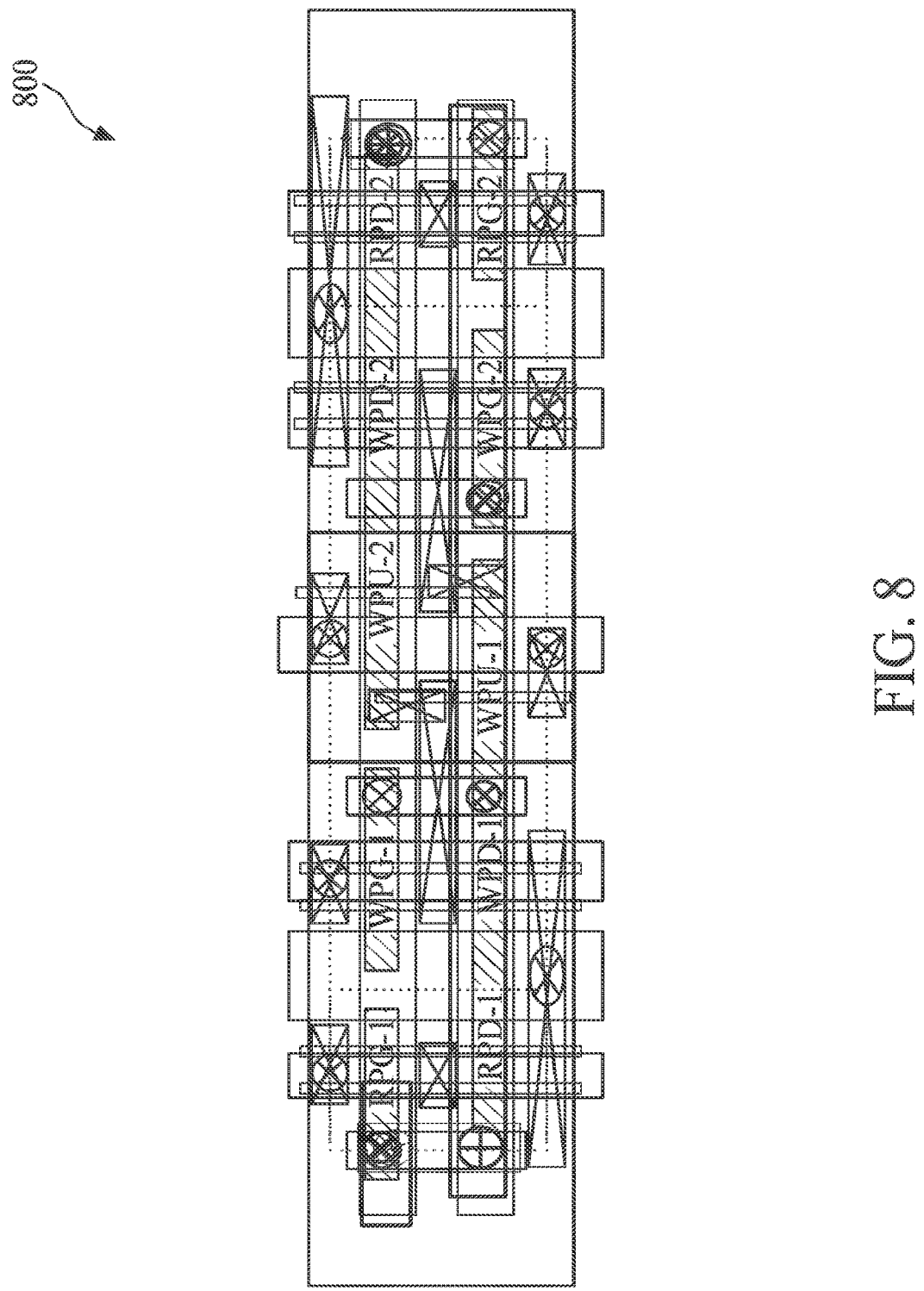
FIG. 8 illustrates a top view of an exemplary layout of a three-port SRAM cell according to various aspects of the present disclosure.
Figure 9A:
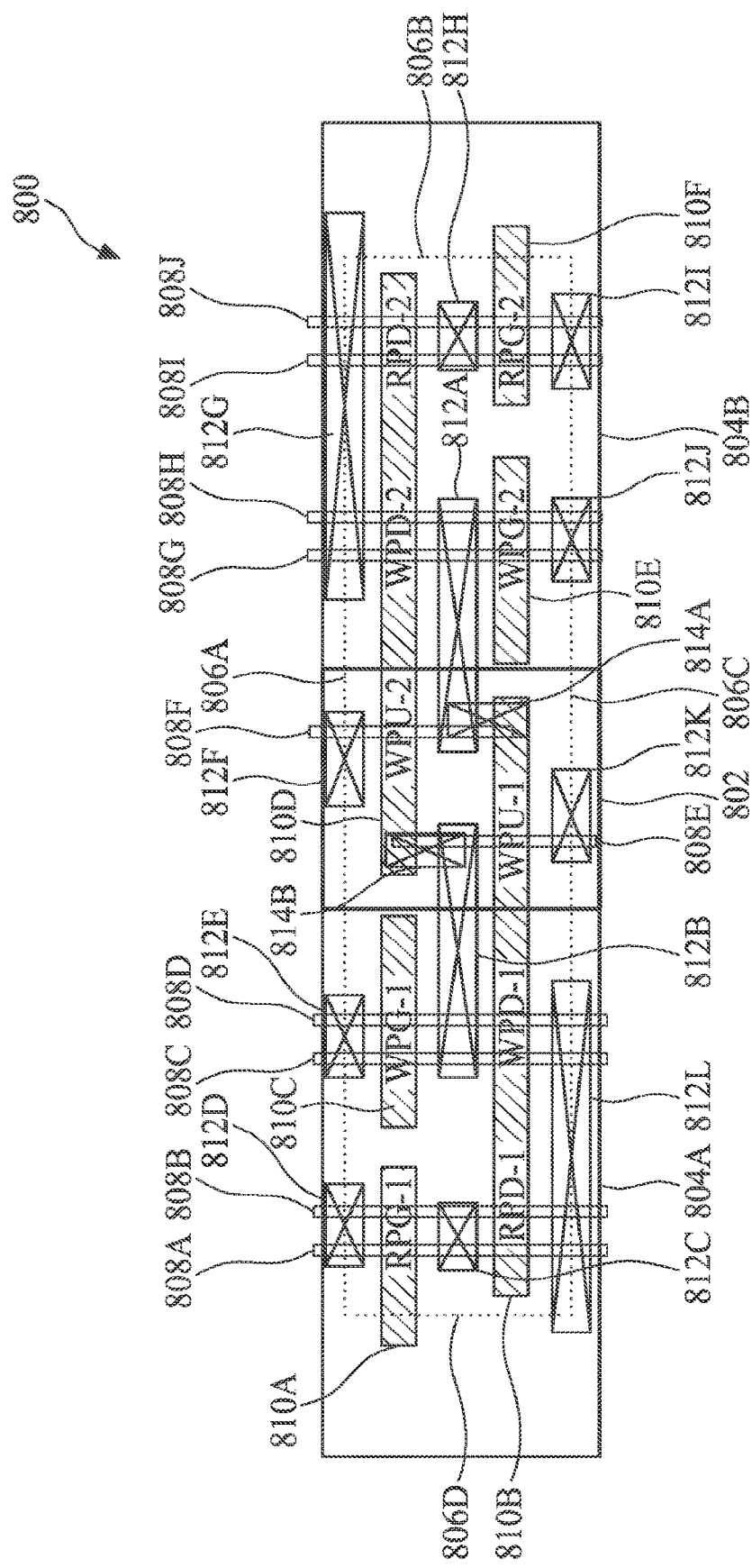
FIGS. 9A-9C illustrate top views of individual layers of an exemplary layout of a three-port SRAM cell according to various aspects of the present disclosure.
Figure 9B:
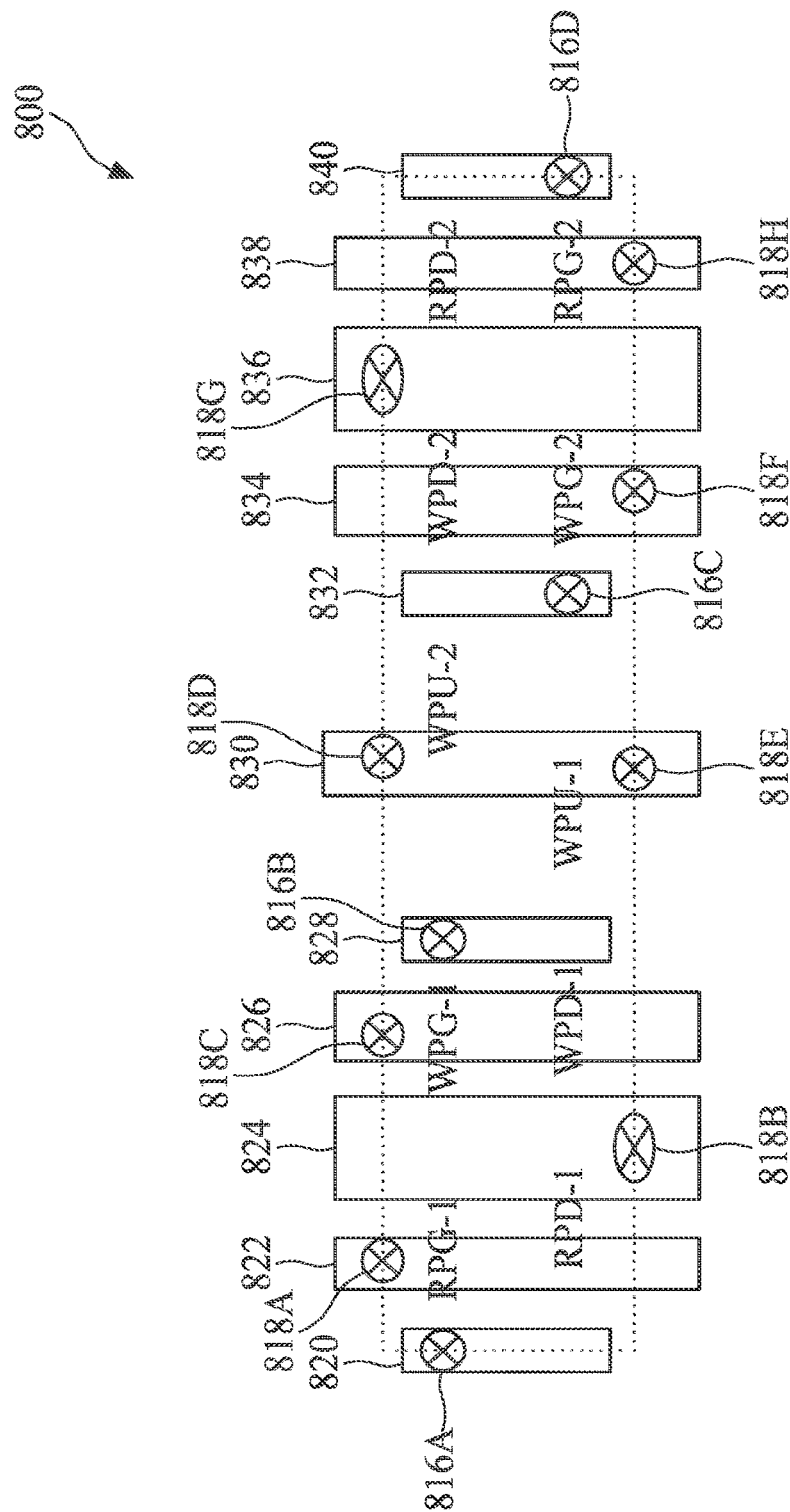
Figure 9C:
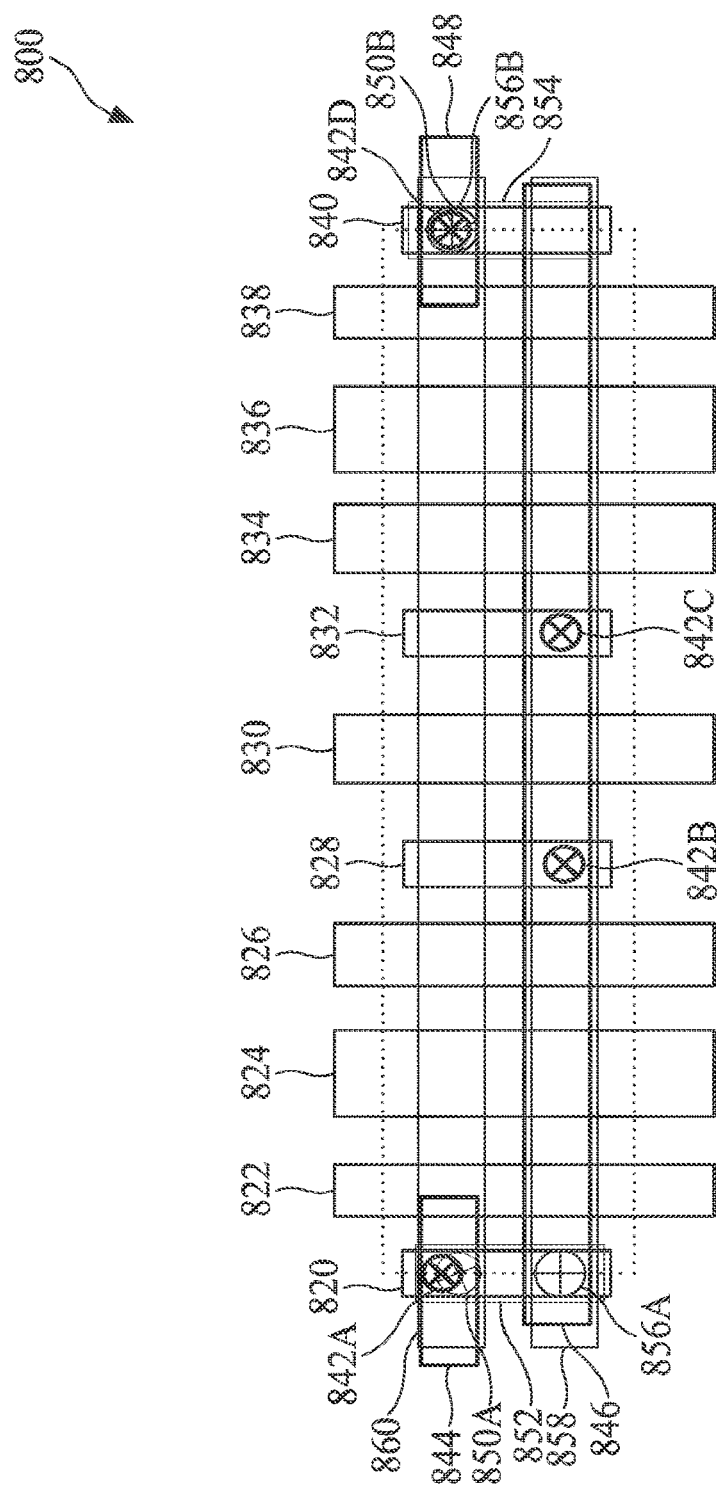

FIG. 8 illustrates a top view of an exemplary three-port SRAM cell layout 800 of the three-port SRAM cell 700 in accordance with various aspects of the present disclosure. FIGS. 9A-9C illustrate top views of individual layers of three-port SRAM cell layout 800. FIG. 9A illustrates front-end features including a substrate, active device regions, gate structures, and contacts, FIG. 9B illustrates middle-of-line features including gate vias, source/drain (S/D) vias, and first metal layer, and FIG. 9C illustrates back-end features including a metal two layer, a metal three layer, a metal four layer, and vias connecting each of the metal layers.

Turning to FIG. 9A, illustrated are front-end features of three-port SRAM cell layout 800 including the substrate, the active device regions, the gate structures, and contacts. Three-port SRAM cell layout 800 includes a substrate (wafer). In some embodiments, the substrate includes silicon. Alternatively, or additionally, the substrate may include another elementary element, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-oninsulator substrates can be fabricated using separation by implantation of oxygen (SIMOX), wafer bonding, and/or other suitable methods.

An n-well region 802 and p-well regions 804A, 804B are disposed in the substrate with a first p-well region 804A disposed on the left side of n-well region 802 and a second p-well region 804B disposed on the right side of n-well region 802. N-type doped regions, such as n-well region 802, are doped with n-type dopants such as phosphorus, arsenic, other n-type dopants, or combinations thereof. P-type doped regions, such as p-well regions 804A, 804B, are doped using p-type dopants such as boron, indium, other p-type dopants, or combinations thereof. The various doped regions can be formed directly on and/or in the substrate, for example, providing a p-well structure, an n-well structure, a dual-well structure, a raised structure, or combinations thereof. An ion implantation process, a diffusion process, and/or other suitable doping process can be performed to form the various doped regions. Outer boundaries 806A, 806B, 806C, and 806D of three-port SRAM cell layout 800 are illustrated using dashed lines, which mark a rectangular region.

Active regions 808A-808J are disposed over the substrate. Active regions 808A, 808B, 808C, 808D are disposed over first p-well region 804A, active regions 808E, 808F are disposed over n-well region 802, and active regions 808G, 808H, 808I, 808J are disposed over second p-well region 804B. In some embodiments, active regions 808A-808J may be fin field-effect transistors (FinFET). In some embodiments, active regions 808A-808J may be a gate-all-around (GAA) device. In some embodiments, active regions 808A-808J may include channel regions disposed in nanosheet channel(s), nanowire channel(s), bar-shaped channel(s), and/or other suitable configurations. As discussed above with respect to in FIG. 2A, each transistor device may include one or more active regions 808A-808J.

Gate electrode 810A forms read pass-gate transistor RPG-1 with the underlying active regions 808A, 808B in first p-well region 804A. Gate electrode 810B forms read pull-down transistor RPD-1 with the underlying active region 808A, 808B in first p-well region 804A. Gate electrode 810B further forms write pull-down transistor WPD-1 with the underlying active regions 808C, 808D in first p-well region 804A. Get electrode 810B further forms write pull-up transistor WPU-1 with the underlying active region 808E in n-well region 802. Gate electrode 810C forms write pass-gate transistor WPG-1 with underlying active regions 808C, 808D in first p-well region 804A. Gate electrode 810D forms write pull-up transistor WPU-2 with underlying active region 808F in n-well region 802. Gate electrode 810D further forms write pull-down transistor WPD-2 with underlying active regions 808G, 808H in second p-well region 804B. Gate electrode 810D further forms read pull-down transistor RPD-2 with underlying active regions 808I, 808J in second p-well region 804B. Gate electrode 810E forms write pass-gate transistor WPG-2 with underlying active regions 808G, 808H in second p-well region 804B. Gate electrode 810F forms read pass-gate transistor RPG-2 with underlying regions 808I, 808J in second p-well region 804B. In some embodiments, pull-up transistors WPU-1 and WPU-2, pull-down transistors WPD-1, WPD-2, RPD-1, and RPD-2, and pass-gate transistors WPG-1, WPG-2, RPG-1, and RPG-1 may be FinFET devices. In some embodiments, pull-up transistors WPU-1 and WPU-2, pull-down transistors WPD-1, WPD-2, RPD-1, and RPD-2, and pass-gate transistors WPG-1, WPG-2, RPG-1, and RPG-2 may be GAA devices having nanosheet channel(s), nanowire channel(s), bar-shaped channel(s), and/or other suitable configurations.

SD node 802 includes a source/drain (S/D) contact 812A and a gate contact 814A. S/D contact 812A is elongated and has a longitudinal direction in the X direction, which is parallel to the extending directions of gate electrodes 810A-810F. Gate contact 814A has a longitudinal direction in the Y direction, which is perpendicular to the X direction. Gate contact 814A includes a portion over, and electrically coupled to, both S/D contact 812A and gate electrode 810B. In some embodiments, S/D contact 812A and gate contact 814A may be formed as a single continuous, or butted, contact. In some embodiments, S/D contact 812A and gate contact 814A may be formed in separate processes to form a butted contact.

SD node 804 includes an S/D contact 812B and a gate contact 814B. S/D contact 812B is elongated and has a longitudinal direction in the X direction. Gate contact 814B has a longitudinal direction in the Y direction. Gate contact 814B includes a portion over, and electrically coupled to both S/D contact 812B and gate electrode 810D. In some embodiments, S/D contact 812B and gate contact 814B may be formed in a single process as a single continuous, or butted, contact. In some embodiments, S/D contact 812B and gate contact 814B may be formed in separate processes to form a butted contact.

S/D contact 812C connects a source/drain region of the read pass-gate transistor RPG-1 to the drain region of the read pull-down transistor RPD-1. S/D contact 812D connects a source/drain region of read pass-gate transistor RPG-1 to read bit-line R_BL-A. S/D contact 812E connects a source/drain region of write pass-gate transistor WPG-1 to write bit-line W_BL. S/D contact 812F connects the source region of write pull-up transistor WPU-1 to Vdd at the Vdd node 414. S/D contact 812G connects the source region of write pull-down transistor WPD-2 and the source region of read pull-down transistor RPD-2 to Vss node 714 and Vss node 716, respectively. S/D contact 812H connects a source/drain region of read pass-gate transistor RPG-2 to the drain region of read pull-down transistor RPD-2. S/D contact 812I connects a source/drain region of read pass-gate transistor RPG-2 to read bit-line R_BL-B. S/D contact 812J connects a source/drain region of write pass-gate transistor WPG-2 to write bit-line bar W_BLB. S/D contact 812K connects the source region of write pull-up transistor WPU-1 to Vdd node 706. S/D contact 812L connects the source regions of write pull-down transistor WPD-1 and read pull-down transistor RPD-1 to Vss node 710 and Vss node 712, respectively.

S/D contacts 812C-812L are elongated and have a longitudinal direction the X direction, parallel to gate electrodes 810A-810F. In some embodiments, one or more elongated S/D contacts 812A-812L may further extend into neighboring SRAM cells that abut SRAM cell 800.

Turning to FIG. 9B, illustrated are additional front-end features of three-port SRAM cell layout 800 including gate vias, source/drain (S/D) vias, and conductive lines (collectively referred to as metal one (M1) layer). These features may be disposed in one or more inter-layer dielectric layers to form interconnect structures. For the sake of clarity, the front-end features illustrated in FIG. 9A are not illustrated in FIG. 9B, while the front-end features still exist, as illustrated in FIG. 8. Gate vias 816A-816D and S/D vias 818A-818H are illustrated using a circle and a "x" sign in the circle. Conductive lines 820-840 are illustrated using rectangles. Each of gate via 816A-816D is disposed over its respective gate electrode and under its respective M1 layer conductive line 820, 828, 832, 840. Each S/D via 818A-818H is disposed over its respective contact and under its respective M1 layer conductive line 822, 824, 826, 830, 834, 836, 838.

Gate via 816A is disposed over, and electrically coupled to, gate electrode 810A and under, and electrically coupled to, conductive line 820, which corresponds to read word-line R_WL-A. Gate via 816B is disposed over, and electrically coupled to, gate electrode 810C and under, and electrically coupled to, conductive line 828, which corresponds to write word-line W_WL. Gate via 816C is disposed over, and electrically coupled to, gate electrode 810E and under, and electrically coupled to, conductive line 832, which corresponds to write word-line W_WL. Gate via 816D is disposed over, and electrically coupled to, gate electrode 810F and under, and electrically coupled to, conductive line 840, which corresponds to read word-line R_WL-B.

S/D via 818A is disposed over, and electrically coupled to, S/D contact 812D and under and electrically coupled to, conductive line 222, which corresponds to read bit-line R_BL-A. S/D via 818B is disposed over, and electrically coupled to, contact 812L and under, and electrically coupled to, conductive line 824, which corresponds to Vss nodes 710, 712. S/D via 818C is disposed over, and electrically coupled to, S/D contact 812E and under, and electrically coupled to, conductive line 826, which corresponds to write bit-line W_BL. S/D via 818D is disposed over, and electrically coupled to, S/D contact 812F and under, and electrically coupled to, conductive line 830, which corresponds to Vdd. S/D via 818E is disposed over, and electrically coupled to, S/D contact 812K and under, and electrically coupled to, conductive line 830, which corresponds to Vdd. S/D via 818F is disposed over, and electrically coupled to, S/D contact 812J and under, and electrically coupled to, conductive line 834, which corresponds to write bit-line bar W_BLB. S/D via 818G is disposed over, and electrically coupled to, S/D contact 812G and under, and electrically coupled to, conductive line 836, which corresponds to Vss nodes 714, 716. S/D via 818H is disposed over, and electrically coupled to, S/D contact 812I and under, and electrically coupled to, conductive line 838, which corresponds to read bit-line R_BL-B.

Conductive lines 820-540 correspond to the Vdd, Vss, write, and read lines described above with respect to FIG. 7. Conductive lines 820-540 extend longitudinally in the Y direction. In some embodiments, conductive lines 820-540 extend into neighboring SRAM cells. In some embodiments, one or more conductive lines 820-540 may be shared with neighboring SRAM cells.

Conductive line 820 is a read word-line landing pad corresponding to read word-line R_WL-A of read pass-gate transistor RPG-1. Conductive line 822 is a read bit-line landing pad corresponding to read bit-line R_BL-A of read pass-gate transistor RPG-1. Conductive line 824 is a first Vss line corresponding to Vss nodes 710, 712. Conductive line 826 is a write bit-line landing pad corresponding to write bit-line W_BL. Conductive line 828 is a first word write-line landing pad corresponding to word write-line W_WL of write pass-gate WPG-1. Conductive line 830 is a first Vdd line corresponding to Vdd node 706. Conductive line 832 is a second word write-line landing pad corresponding to word write-line W_WL of write pass gate WPG-2. Conductive line 834 is a word bit-line bar landing pad corresponding to word bit-line bar W_BLB 408. Conductive line 836 is a second Vss line corresponding to Vss nodes 714, 716. Conductive line 838 is a read bit-line landing pad corresponding to read bit-line R_BL-B of read pass-gate RPG-2. Conductive line 840 is a read word-line landing pad corresponding to read word-line R_WL-B of read pass-gate RPG-2.

Turning to FIG. 9C, illustrated are back-end features of three-port SRAM cell 800 including a metal two (M2) layer, a metal three (M3) layer, a metal four (M4) layer, and vias connecting each of the metal layers. Vias are illustrated using a circle and a "x" sign in the circle. For the sake of clarity, only the conductive lines of M1 layer of the front-end features as shown in FIG. 9B are illustrated in FIG. 9C, though the other front-end features still exist, as illustrated in FIG. 8.

Via 842A is disposed over, and electrically coupled to, M1 conductive line 820 and under, and electrically coupled to, M2 conductive line 844 as a read word-line landing pad corresponding to R_WL-A. Via 842B is disposed over, and electrically coupled to, M1 conductive line 828 and under, and electrically coupled to, M2 conductive line 846 corresponding to write word-line W_WL. Via 842C is disposed over, and electrically coupled to, M1 conductive line 832 and under, and electrically coupled to, an M2 conductive line 846 corresponding to write word-line W_WL. Via 842D is disposed over, and electrically coupled to, M1 conductive line 840 and under, and electrically coupled to, an M2 conductive line 848 as a read word-line landing pad corresponding to R_WL-B. M2 conductive lines 844, 846, 848 extend longitudinally in the X direction.

Via 850A is disposed over, and electrically coupled to, M2 conductive line 844 and under, and electrically coupled to, an M3 conductive line 852 as a read word-line landing pad. Via 850B is disposed over, and electrically coupled to, M2 conductive line 848 and under, and electrically coupled to, an M3 conductive line 854 as a word read-line landing pad. M3 conductive lines 852, 854 extend longitudinally in the Y direction, perpendicular to the X direction.

Via 856A is disposed over, and electrically coupled to, M3 conductive line 852 and under, and electrically coupled to an M4 conductive line 858 corresponding to read word-line R_WL-A. Via 856B is disposed over, and electrically coupled to, M3 conductive line 854 and under, and electrically coupled to an M4 conductive line 860 corresponding to read word-line R_WL-B. M4 conductive line 858, 860 extend longitudinally in the X direction.

Two-port SRAM cell layout 500 and three-port SRAM cell layout 800 provide additional improvements to those discussed above with respect to two-port SRAM cell layout 200. The new connection structure of two-port SRAM cell layout 500 and three-port SRAM cell layout 800 require fewer M1 metal lines to finish key cell connections that previous layout methods. Generally, fewer M1 metal lines improves the scalability of the cell layout. Combining the reduction in M1 metal lines with the benefits discussed above further improves the speed and performance of the SRAM cell.

As used throughout the present disclosure, a gate structure may include a gate dielectric layer, a gate electrode, and gate spacers. The gate structures may include numerous other layers, for example, capping layers, interface layers, diffusion layers, barrier layers, hard mask layers, or combinations thereof. In the depicted embodiment, gate dielectric includes a high-k dielectric layer, which includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof.

High-k dielectric material generally refers to dielectric materials having a high dielectric constant, for example, greater than that of silicon oxide (k≈3.9). The high-k dielectric layer is formed by ALD, CVD, PVD, oxidation-based deposition process, other suitable process, or combinations thereof. In some embodiments, gate dielectric includes an interfacial layer disposed between the high-k dielectric layer and channel layers.

Gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer is an n-type work function layer and includes any suitable work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the work function layer includes a p-type work function material such as Ru, Mo, Al, TiN, TaN, WN, ZrSi$_2$, MoSi$_2$, TaSi$_2$, NiSi$_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The work function layer and/or the conductive bulk layer are formed by ALD, CVD, PVD, plating, other deposition process, or combinations thereof.

Gate spacer dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over a gate structure and subsequently etched (e.g., anisotropically etched) to form gate spacer. In some embodiments, gate spacers include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to gate structure. In such implementations, the various sets of spacers can include materials having different etch rates. For example, a first dielectric layer including silicon and oxygen (e.g., silicon oxide) can be deposited and etched to form a first spacer set adjacent to the gate structure, and a second dielectric layer including silicon and nitrogen (e.g., silicon nitride) can be deposited and etched to form a second spacer set adjacent to the first spacer set.

The present disclosure provides for many different embodiments. An exemplary device includes an integrated circuit structure that includes a memory cell and an interconnect structure disposed over and electrically coupled to the memory cell. The interconnect structure includes a first metal layer having a bit line, a first voltage line configured to receive a first voltage, a word line landing pad, a bit line bar, and a second voltage line configured to receive a second voltage that is different from the first voltage. The first metal layer is electrically coupled to the memory cell. The interconnect structure further includes a second metal layer disposed over the first metal layer where the second metal layer includes a word line electrically coupled to the word line landing pad. The word line landing pad is disposed between the first voltage line and the bit line bar and the first voltage line and the bit line bar are disposed between the bit line and the second voltage line.

Another exemplary device includes an integrated circuit structure having a memory cell and an interconnect structure. The memory cell has a pull-up device and a pull-down device and a pass-gate device. The pull-up device and the pull-down device share a first gate structure and the pass-gate device has a second gate structure. The interconnect structure includes a first metal layer and a second metal layer. The first metal layer includes a bit line, a first voltage line connected to the pull-up device and configured to receive a first voltage, a word line landing pad connected to the pass-gate device, a bit line bar connected to the pass-gate device, and a second voltage line connected to the pull-down device and configured to receive a second voltage that is different from the first voltage. The second metal layer is disposed over the first metal layer and includes a word line connected to the word line landing pad. The first voltage line is adjacent to the bit line, the word line landing pad is adjacent to the first voltage line, the bit line bar is adjacent to the word line landing pad, and the second voltage line is adjacent to the bit line bar. The word line landing pad is between the pull-up device and the pull-down device.

An exemplary method includes an integrated circuit structure including a memory cell and an interconnect structure. The memory cell includes a pull-up device, a pull-down device, a first pass-gate device, and a second pass-gate device. The pull-up device and the pull-down device share a first gate structure, the first pass-gate device has a second gate structure, and the second pass-gate device has a third gate structure. The interconnect structure includes a first metal layer and a second metal layer. The first metal layer that includes a bit line, a first voltage line configured to receive a first voltage, a word line landing pad connected to the second gate structure, a bit line bar connected to the first pass-gate device, and a second voltage line configured to receive a second voltage that is different from the first voltage. The second metal layer is disposed over the first metal layer. The second metal layer includes a word line connected to the word line landing pad. The first voltage line is adjacent to the bit line, the word line landing pad is adjacent to the first voltage line, the bit line bar is adjacent to the word line landing pad, and the second voltage line is adjacent to the bit line bar. The word line landing pad extends over the first gate structure and the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a memory cell; and forming an interconnect structure over and electrically coupled to the memory cell, wherein the forming the interconnect structure includes:
  forming a first metal layer electrically coupled to the memory cell, wherein the first metal layer includes a bit line, a first voltage line configured to receive a first voltage, a word line landing pad, a bit line bar, and a second voltage line configured to receive a second voltage that is different from the first voltage, and
  forming a second metal layer over the first metal layer, wherein the second metal layer includes a word line electrically coupled to the word line landing pad, wherein the word line landing pad is between the first voltage line and the bit line bar and the first voltage line and the bit line bar are between the bit line and the second voltage line.

2. The method of claim 1, wherein the first metal layer further includes a third voltage line configured to receive the second voltage, wherein the bit line is disposed between the third voltage line and the first voltage line.

3. The method of claim 2, wherein the word line landing pad is a first word line landing pad and the first metal layer further includes a second word line landing pad, wherein the third voltage line is disposed between the second word line landing pad and the bit line.

4. The method of claim 3, wherein the word line of the second metal layer is electrically coupled to the second word line landing pad.

5. The method of claim 1, wherein the bit line is a first bit line and the method further includes forming a second bit line, wherein the second voltage line is disposed between the second bit line and the bit line bar.

6. The method of claim 1, wherein the word line landing pad is a first word line landing pad and the first metal layer further includes a second word line landing pad, wherein the second voltage line is disposed between the second word line landing pad and the bit line bar.

7. The method of claim 6, further comprising forming a third metal layer, wherein the third metal layer is electrically coupled to the second word line landing pad.

8. A method comprising:
  forming a memory cell having a pull-up device, a pull-down device, and a pass-gate device, wherein the pull-up device and the pull-down device share a first gate structure, and wherein the pass-gate device has a second gate structure; and
  forming an interconnect structure, wherein the forming the interconnect structure includes:
    forming a first metal layer that includes a bit line, a first voltage line connected to the pull-up device and configured to receive a first voltage, a word line landing pad connected to the pass-gate device, a bit line bar connected to the pass-gate device, and a second voltage line connected to the pull-down device and configured to receive a second voltage that is different from the first voltage,
    forming a second metal layer over the first metal layer, wherein the second metal layer includes a word line connected to the word line landing pad,
    wherein the first voltage line is adjacent to the bit line, the word line landing pad is adjacent to the first voltage line, the bit line bar is adjacent to the word line landing pad, and the second voltage line is adjacent to the bit line bar, and
    wherein the word line landing pad is between the pull-up device and the pull-down device.

9. The method of claim 8, wherein the pull-up device is a first pull-up device, the memory cell further includes a second pull-up device, and the first voltage line is connected to the second pull-up device.

10. The method of claim 8, wherein the pass-gate device is a first pass-gate device, the memory cell further includes a second pass-gate device, and the bit line is connected to the second pass-gate device.

11. The method of claim 10, wherein the pull-down device is a first pull-down device, the memory cell further includes a second pull-down device, the first metal layer further includes a third voltage line connected to the second pull-down device that is configured to receive the second voltage, and the third voltage line is adjacent the bit line.

12. The method of claim 8, wherein the pull-down device is a first pull-down device, the memory cell further includes a second pull-down device that shares the first gate structure with the pull-up device and the first pull-down device, and the second voltage line is connected to the second pull-down device.

13. The method of claim 8, wherein the pass-gate device is a first pass-gate device, the bit line is a first bit line, the memory cell further includes a second pass-gate device, the first metal layer further includes a second bit line connected to the second pass-gate device, and the second bit line is adjacent the second voltage line.

14. The method of claim 13, wherein the word line landing pad is a first word line landing pad, the first metal layer further includes a second word line landing pad connected to the second pass-gate device, and the second word line landing pad is adjacent the second bit line.

15. A method comprising:
  forming a memory cell having a pull-up device, a pull-down device, a first pass-gate device, and a second pass-gate device, wherein the pull-up device and the pull-down device share a first gate structure, wherein the first pass-gate device has a second gate structure, and the second pass-gate device has a third gate structure; and
  forming an interconnect structure, wherein the forming the interconnect structure includes:
    forming a first metal layer that includes a bit line, a first voltage line configured to receive a first voltage, a word line landing pad connected to the second gate structure, a bit line bar connected to the first pass-gate device, and a second voltage line configured to receive a second voltage that is different from the first voltage,
    forming a second metal layer over the first metal layer, wherein the second metal layer includes a word line connected to the word line landing pad,
    wherein the first voltage line is adjacent to the bit line, the word line landing pad is adjacent to the first voltage line, the bit line bar is adjacent to the word line landing pad, and the second voltage line is adjacent to the bit line bar, and
    wherein the word line landing pad extends over the first gate structure and the second gate structure.

16. The method of claim 15, wherein:
  the second gate structure has a first end adjacent the first voltage line and a second opposing end adjacent the third gate structure; and
  the forming the interconnect structure further includes forming a via connecting the second gate structure to the word line landing pad, wherein the via is disposed at the first end of the second gate structure.

17. The method of claim 15, wherein the bit line is a first bit line, the first metal layer further includes a second bit line connected to the second pass-gate device, and the second bit line is adjacent the second voltage line.

18. The method of claim 17, wherein the word line landing pad is a first word line landing pad, the first metal layer further includes a second word line landing pad connected to the third gate structure, and the second word line landing pad is adjacent the second bit line.

19. The method of claim 18, wherein the word line is a first word line and the forming the interconnect structure further includes forming a third metal layer over the second metal layer, wherein the third metal layer includes a second word line that is different than the first word line, wherein the second word line is connected to the second word line landing pad.

20. The method of claim 15, wherein the first voltage line has a first width and the second voltage line has a second width that is greater than the first width.

* * * * *